US00RE42308E

(19) United States
(12) Reissued Patent
Hirayama

(10) Patent Number: US RE42,308 E
(45) Date of Reissued Patent: Apr. 26, 2011

(54) DISPLAY SUBSTRATE, ELECTRO-OPTICAL DEVICE, AND ELECTRONIC APPARATUS

(75) Inventor: Hiroshi Hirayama, Suwa (JP)

(73) Assignee: Seiko Epson Corporation, Tokyo (JP)

(21) Appl. No.: 12/230,256

(22) Filed: Aug. 26, 2008

Related U.S. Patent Documents

Reissue of:
(64) Patent No.: 7,106,279
Issued: Sep. 12, 2006
Appl. No.: 10/460,388
Filed: Jun. 13, 2003

(30) Foreign Application Priority Data

Jun. 21, 2002 (JP) ..... 2002-182149
Oct. 30, 2002 (JP) ..... 2002-316079
Jun. 12, 2003 (JP) ..... 2003-168065

(51) Int. Cl.
*G09G 3/28* (2006.01)

(52) U.S. Cl. ..... 345/67; 345/80; 345/81

(58) Field of Classification Search ..... 345/80–100, 345/204–206, 211, 214, 67; 349/143, 147, 349/149, 141
See application file for complete search history.

(56) References Cited

U.S. PATENT DOCUMENTS 5,978,059 A 11/1999 Ohta et al.
6,137,218 A 10/2000 Kaneko et al.
6,369,515 B1 * 4/2002 Okuda ..... 315/169.3
6,404,414 B2 * 6/2002 Ishii ..... 345/90
6,753,839 B2 * 6/2004 Fujita ..... 345/92
7,106,279 B2 * 9/2006 Hirayama ..... 345/67
7,164,408 B2 * 1/2007 Murade ..... 345/100
2004/0160563 A1 8/2004 Ashizawa et al.

FOREIGN PATENT DOCUMENTS

JP 10-171369 6/1998
JP A-10-171369 6/1998
JP A-2002-108252 4/2002
JP 2002-151276 5/2002
JP A-2002-151276 5/2002
JP 2002-287663 10/2002
JP A-2002-287663 10/2002
WO WO 98/36407 8/1998

OTHER PUBLICATIONS

Office Action from related U.S. Appl. No. 12/756,405, dated Aug. 27, 2010.

* cited by examiner

*Primary Examiner* — Quan-Zhen Wang
*Assistant Examiner* — Mansour M Said
(74) *Attorney, Agent, or Firm* — Oliff & Berridge, PLC

(57) ABSTRACT

To provide an electro-optical device and an electronic apparatus capable of maintaining the display quality by preventing brightness unevenness without widening a frame in a mounting terminal portion connection portions connecting to a fourth power source bus line are provided in two places. Driving current is supplied from the connection portions to the fourth power source bus line. The width of the fourth power source bus line is smaller than that of the width of a power source bus line supplying driving current from one place of the mounting terminal portion.

18 Claims, 18 Drawing Sheets

(a)

(b)

(c)

(a)

(b)

DISPLAY SUBSTRATE, ELECTRO-OPTICAL DEVICE, AND ELECTRONIC APPARATUS

Matter enclosed in heavy brackets [ ] appears in the original patent but forms no part of this reissue specification; matter printed in italics indicates the additions made by reissue.

BACKGROUND OF THE INVENTION

1. Field of Invention

The present invention relates to electro-optical devices and electronic apparatuses, and more specifically, it relates to an electro-optical device to drive a current-driven element and to an electronic apparatus.

2. Description of Related Art

In the related art, various electro-optical devices such as organic EL panels with current-driven elements have been disclosed. As illustrated in FIG. 18, a related art electro-optical device includes a matrix display portion 100 with a plurality of current-drive elements (not shown), a frame portion 101 formed at the periphery of the matrix display portion 100, a mounting terminal portion 102 provided at one edge of the frame portion 101, a power source bus line 103, which is a conductive line arranged in the frame portion 101 and which is connected to the mounting terminal portion 102, and n ($n \geqq 1$) power source lines 104 connected to the power source bus line 103, the power source lines 104 supplying driving current to the current-drive elements.

The frame portion 101 includes a first region 101a, which is formed at the periphery of the matrix display portion 100, including the mounting terminal portion 102, a second region 101b arranged so that the matrix display portion 100 is interposed between the first region 101a and the second region 101b, and a third region 101c and a fourth region 101d to connect the second region 101b to the first region 101a.

The power source bus line 103 includes one continuous conductive line and is made of a metal such as Al or AlSiCu. The power source bus line 103 includes a power source supply portion 103b provided in the part of the frame portion 101 on one side (the second region 101b in this related art) and connected to the plurality of power source lines 104, and a conductive portion 103a (that is arranged in the third region 101c in this related art) to connect one end of the power source supply portion 103b to the mounting terminal portion 102. The conductive portion 103a has a section whose width is $W_1$ and whose height (thickness) is t. The supply portion 103b has a section whose width is $W_2$ and whose height (thickness) is t. The n power source lines 104 are all led out from the supply portion 103b and are connected to the current-drive element.

The driving current of the current-drive element is supplied from the mounting terminal portion 102 to the device, passes through the conductive portion 103a of the power source bus line 103, is led to the supply portion 103b, is sent into the respective power source lines 104, and is supplied to each current-drive element.

However, the aforementioned related art technology has the following problems.

First, as illustrated in FIG. 18, in order to arrange the conductive portion 103a in the third region 101c, the third region 101c of the frame portion 101 becomes wider by the width $W_1$ of the conductive portion 103a. It is preferable that the frame portion 101 formed at the periphery of the matrix display portion 100 be as narrow as possible for purposes of miniaturization.

Second, as illustrated in FIG. 18, in the case where the position of the connection between the mounting terminal portion 102 and the conductive portion 103a, that is, the feeding point of the corresponding electro-optical device is made point A, the position where the power source line 104 $X_1$ closest to the conductive portion 103a is connected to the supply portion 103b is made point B, and the position where the power source line 104 $X_n$ remotest from the conductive portion 103a is connected to the supply portion 103b is made point C, electric potentials in the respective points A, B, and C are indicated as $V_A$, $V_B$, and $V_C$, voltage drops by V1 at the point C separated from the point B by the distance $L_1$, as illustrated in FIG. 19. For simplification, the graph of FIG. 19 illustrates a construction wherein almost constant current is supplied to all of the current-drive elements.

Because the current supplied to each current-drive element varies according to applied voltage, the voltage drop causes unevenness in current supply in the direction parallel to the supply portion 103b (in general, the direction parallel to the signal line (a scanning line (not shown)) by which the timing of supply of the data of each current-drive element is controlled). In the case where the current-drive element is a light emitting element, the voltage drop causes brightness unevenness. Thus, the display quality of the electro-optical device deteriorates. Even if the influence of static voltage error is excluded using a current program circuit, the common impedance of the supply portion 103b is large. Thus, unevenness in dynamic current supply and brightness unevenness is caused by the dynamic voltage variation, and deterioration in the display quality results.

Furthermore, as illustrated in FIG. 18, when a position closest to the power source line 104$X_1$ is the point D and when $V_D$ indicates voltage value at the point D, as illustrated in FIG. 20, there is the problem that voltage value $V_D$ is reduced by the electric potential difference V2 from $V_B$ at the point B separated from the point D by the distance $L_2$.

This voltage drop causes brightness unevenness in a vertical direction, and thereby deteriorates the display quality of the electro-optical device. Even if the influence of the static voltage error is excluded using a current program circuit, the common impedance of the power source lines 104 is large. Thus, unevenness in the dynamic current supply and the brightness unevenness is caused by the dynamic voltage variation, and deterioration in the display quality results. In order to solve this problem, both ends of the power source line 104 may be connected to power source terminals. For example, see Japanese Unexamined Patent Application Publication No. 2002-108252.

SUMMARY OF THE INVENTION

In a related art example illustrated in FIG. 18, in order to arrange a conductive portion 103a in a third region 101c, the third region 101c of a frame portion 101 becomes wider by the width $W_1$ of the conductive portion 103a. Also, power source lines 104 are connected to a power source terminal through a power source bus line 103, and the voltage drop in the power source bus line 103 cannot be ignored. Because the voltage drop is caused by the driving current meeting internal resistance (common impedance) of the power source bus line, it is possible to reduce or prevent the voltage drop by significantly increasing the width of the power source bus line to reduce the common impedance. However, as the width of the power source bus line increases, the width of the frame portion 101 also increases. Therefore, the size of the device increases.

This invention is made in consideration of the aforementioned problems. Accordingly, an object of the present invention is to enhance the display quality of electro-optical devices and electronic apparatuses by preventing current unevenness and brightness unevenness without increasing the width of the frame.

The present invention provides an electro-optical device including a plurality of pixel circuits provided in the effective region of a base, each pixel circuit including an electro-optical element, a plurality of power source lines connected to the plurality of pixel circuits, respectively, in order to supply driving voltages to the plurality of pixel circuits, and a power source bus line provided between at least one of a plurality of edges of the base and the effective region and connected to the plurality of power source lines.

The effective region refers to the matrix display portion or an image display portion, the region in which a plurality of pixel circuits including electro-optical elements are arranged in matrices.

According to the above structure, it is possible to narrow the frame.

According to the electro-optical device of the present invention, the power source bus line is provided outside the effective region.

According to the above structure, it is possible to reduce the number of intersections between the power source bus line and the plurality of electro-optical element-containing electro-optical element-containing pixel circuits formed in the effective region, and thereby reducing the risk of disconnection.

The present invention provides a display substrate including a pixel circuit unit provided on a base and including a plurality of pixel circuits to drive electro-optical elements, a plurality of power source lines connected to the plurality of pixel circuits, respectively, in order to supply driving voltages to the plurality of pixel circuits, and a power source bus line provided between at least one of the plurality of edges of the base and the pixel circuit unit and connected to the plurality of power source lines.

According to the above structure, because it is possible to reduce the number of intersections between the power source bus line and the plurality of electro-optical element-containing electro-optical element-containing pixel circuits formed in the effective region. Thus, it is possible to reduce the risk of disconnection and to narrow the frame.

According to the display substrate of the present invention, the power source bus line is provided outside the pixel circuit unit.

According to the above structure, it is possible to reduce the number of intersections between the power source bus line and the plurality of electro-optical element-containing pixel circuits formed in the effective region, and thereby to reduce the risk of disconnection.

The display substrate may include a power-source-mounting terminal portion to connect the display substrate to a wiring line substrate provided outside the display substrate and to supply the driving voltages.

The power source bus line is connected to the power-source-mounting terminal portion in at least one place.

The wiring line substrate is, for example, a print board loaded with other electronic parts required for driving.

According to the above structure, it is possible to reduce the number of intersections between the power source bus line and the plurality of electro-optical element-containing pixel circuits formed in the effective region. Thus, it is possible to reduce the risk of disconnection and to narrow the frame.

The display substrate may include at least two power-source-mounting terminal portions to connect the display substrate to a wiring line substrate provided outside the display substrate and to supply the driving voltages.

The power source bus line is connected to the at least two power-source-mounting terminal portions.

According to the above structure, it is possible to reduce the number of intersection between the power source bus line and the plurality of electro-optical element-containing pixel circuits formed in the effective region. Thus, it is possible to reduce the risk of disconnection and to narrow the frame.

The display substrate is characterized by a mounting terminal portion between at least one of the plurality of edges of the base and the pixel circuit unit, this mounting terminal portion being to connect the display substrate to a wiring line substrate provided outside the display substrate, and the power source bus line being interposed between the pixel circuit unit and the mounting terminal portion.

The mounting terminal portions are to connect the display substrate to the wiring line substrate. A mounted terminal for the power source is included among the mounting terminals.

According to the above structure, it is possible to reduce the number of intersections between the power source bus line and the plurality of electro-optical element-containing pixel circuits formed in the effective region. Thus, it is possible to reduce the risk of disconnection and to narrow the frame.

The at least two mounting terminals for the power source are provided along the at least one edge.

Signal-mounting terminal portions, arranged along the at least one edge to supply signals from the wiring line substrate to the plurality of pixel circuits, are provided between the at least two power-source-mounting terminal portions.

The mounting terminal is for connecting the display substrate to the wiring line substrate. The mounting terminal for the power source and the mounting terminal for signals are included among the mounting terminals.

According to the above structure, it is possible to reduce the number of intersections between the power source bus line and the plurality of electro-optical element-containing pixel circuits formed in the effective region. Thus, it is possible to reduce the risk of disconnection and to narrow the frame.

The present invention provides an electro-optical device including a matrix display portion with a plurality of current-drive elements, mounting terminal portions provided at one side of a frame portion formed at the periphery of the matrix display portion, and power source bus lines to connect power source lines to supply driving current to the current-drive elements, the power source bus lines being connected to the mounting terminal portions and included in the frame. The mounting terminal portion includes connection portions for the power source bus lines at at least two positions, and the driving current is divided to be supplied at the connection portions to the power source bus lines.

According to the above device, the driving current supplied to the current-drive elements is dividedly supplied at portions provided in the mounting terminal connecting with power source bus line at at least two positions, to prevent the voltage drop. That is, it is possible to suppress the brightness unevenness and also to make the brightness unevenness right-left symmetrical, which makes it difficult to be visually sensed. Thus, it is possible to prevent the deterioration of the display quality of the electro-optical device.

In the electro-optical device of the present invention, the power source bus lines include at least two conductive lines, one end of each conductive line are connected to different connection portions of the mounting terminal portion, and the other end of each of the conductive lines is connected to the power source line.

The width of the power source bus lines is W and the height of the power source bus lines is t, and in the case where the driving current is supplied from one mounting terminal portion, if the width of the power source bus lines is $W_0$ and the height of the power source bus lines is t, the width W is smaller than the width $W_0$.

According to the above device, it is possible to prevent the voltage drop without increasing the width of the power source bus line greater than that of the power source bus line connected to one place in the conventional mounting terminal portion, that is, without widening the region of the frame in which the power source bus line is arranged.

In the electro-optical device of the present invention, the power source bus lines include at least one independent conductive line, the two ends of the conductive lines are connected to a different connection portion of the mounting terminal portion, and the conductive lines are connected to one end of the power source lines. The width of the power source bus lines is W and the height of the power source bus lines is t, and in the case where the driving current is supplied from one mounting terminal portion, if the width of the power source bus lines is $W_0$ and the height of the power source bus lines is t, the width W is smaller than the width $W_0$.

According to the above device, it is possible to prevent the voltage drop without increasing the width of the power source bus line to be greater than that of the power source bus line connected to one place in the conventional mounting terminal, that is, without widening the region of the frame portion in which the power source bus line is arranged.

In the electro-optical device of the present invention, one or more power source bus lines are provided corresponding to the red, green, and blue current-drive elements.

According to the above device, current is supplied from independent power source bus lines to the red, green, and blue current-drive elements, and thus it is possible to appropriately correct the value of each of the currents supplied to the red, green, and blue current-drive elements. Therefore, it is possible to obtain an effective electro-optical device with reduced display irregularity.

An electronic apparatus according to the present invention includes one or more of the above electro-optical devices.

According to the above method, it is possible to maintain an excellent luminescent gray scale characteristic. Thus, it is possible to reduce or prevent the brightness unevenness and thereby to realize an electronic apparatus having a display portion with excellent display quality.

The prevent invention provides an electro-optical device including electro-optical elements, first wiring lines to supply either a control signal or a driving power supply to the electro-optical elements, and a second wiring line to supply the control signal or the driving power supply which is not supplied by the first wiring line to the electro-optical elements. The first wiring lines each have a narrow portion at the intersection between the first wiring line and the second wiring line. The narrow portion of the wiring line is a portion with width partially reduced as viewed from above the sectional area notwithstanding.

According to the above structure, the area of intersection between a driving power source line and a signal line, such as a display data signal line is reduced by providing the narrow portion in the driving power source line. Thus, it is possible to reduce the value of parasitic capacitance generated at the intersection between the driving power source line and the signal line.

The control signal is a display data signal supplied to the electro-optical device or a clock signal, an enable signal, or a driving controlling signal supplied to a driving circuit, or a pixel circuit control signal to control a pixel circuit.

In this case, it is preferable that the second wiring line include a main wiring line portion provided in the same wiring line layer as the first wiring line, a bypass wiring line provided in a different wiring line layer from the first wiring line and intersecting the narrow portion at a different layer, and a connection portion to connect the main wiring portion and the bypass wiring line portion to each other situated close to the narrow portion. Therefore, it is possible to significantly reduce the length of the bypass wiring portion and thereby to reduce or prevent the increase in the resistance value of the entire second wiring line even if the sheet resistance value of the bypass wiring line is large. Therefore, it is possible to reduce the time constant (the resistance value multiplied by the parasitic capacitance) of the second wiring line and thereby to enhance the response characteristic of a device.

In these cases, it is possible to also provide a narrow portion in the second wiring line at the intersection between the narrow portion of the first wiring line and the second wiring line. In this way, it is possible to further reduce the parasitic capacitance by the combined effect of the narrow portions of both wiring lines for the above reason.

In the above case, it is possible to form the narrow portion of a wiring line at one edge in the width direction of the wiring line. By doing so, it is possible to simplify the shape of the wiring line. Thus, it is possible to easily manufacture the wiring line and to reduce or prevent generation of unnecessary, harmful radiation.

On the other hand, the narrow portion may include cut-out portions at both edges in the width direction of the corresponding wiring lines. By doing so, current flows smoothly in the wiring line. Therefore, in the case where the width of the wiring line is large, it is possible to reduce the value of effective resistance lower than the case where the narrow portion is formed at one edge.

The narrow portion may be formed such that there is one path or plural paths provided in the wiring line. The narrow portion may thus be divided into a plurality of portions, making it possible to make the narrow portion resistant against disconnection caused by an external shock.

The present invention provides an electro-optical device, including a display portion having a plurality of electro-optical elements with different characteristics, a plurality of power source bus lines provided corresponding to the electro-optical elements, the power source bus lines supplying a driving power supply to the display portion, and signal lines to supply control signals to the display portion. The plurality of power source bus lines include narrow portions at intersections between the signal lines and the power source bus lines. Therefore, it is possible to supply an optimal driving power source to the electro-optical elements with different electric characteristics, while maintaining the above effects.

In this case, the signal lines each include a main wiring line portion provided in the same wiring line layer as the plurality of power source bus lines, a bypass wiring line portion provided in a different wiring line layer from the plurality of power source bus lines and intersecting the narrow portion at a different layer, and a connection position to connect the main wiring line portion and the bypass wiring line portion to each other. Also, in this case, it is possible to prepare a narrow portion in the signal line at the intersection between the driving power source line and the narrow portion.

In these cases, it is preferable that the plurality of the power source bus lines keep roughly the same interval of separation from each other at the narrow portions. Accordingly, it is possible to further reduce the total of the widths of the narrow portions and the distances between the power source bus lines and thereby to further reduce the length of the bypass wiring line 57.

Further, in this case, in one part of or in the whole narrow portion of the one power source bus line overlaps the region where another power source bus line would be if it did not have a narrow portion. By doing so, it is possible to arrange the narrow portions of the plurality of driving power source lines to be close to each other and thereby to reduce the length of the bypass wiring line that bypasses all of the narrow portions of the plurality of driving power source lines.

In this case, the narrow portions of the plurality of power source bus lines may be symmetric with respect to the longitudinal line through the width-wise center of the region of the plurality of power source bus lines. By doing so, it is possible to reduce the sum of the lengths of the narrow portions of the respective driving power source lines and thereby to reduce the amount of the increase in the resistance value of the driving power source line in the narrow portion.

The plurality of electro-optical elements with different characteristics may include electro-optical elements with different light emitting colors.

The prevent invention provides an electronic apparatus including the above electro-optical device; wiring lines supplying a driving power source or a driving power source circuit to supply a driving power supply to the driving power source, connected to the electro-optical device; and a control signal generating circuit connected to the electro-optical device to supply control signals to wiring lines or signal lines to supply the control signal. It is possible to improve display performance by this electro-optical device with excellent luminescent gray scale characteristic.

DETAILED DESCRIPTION OF PREFERRED EMBODIMENTS

An electro-optical device and an electronic apparatus according to exemplary embodiments of the present invention will now be described in detail with reference to the drawings.

First Exemplary Embodiment of Electro-Optical Device

Figure 1:
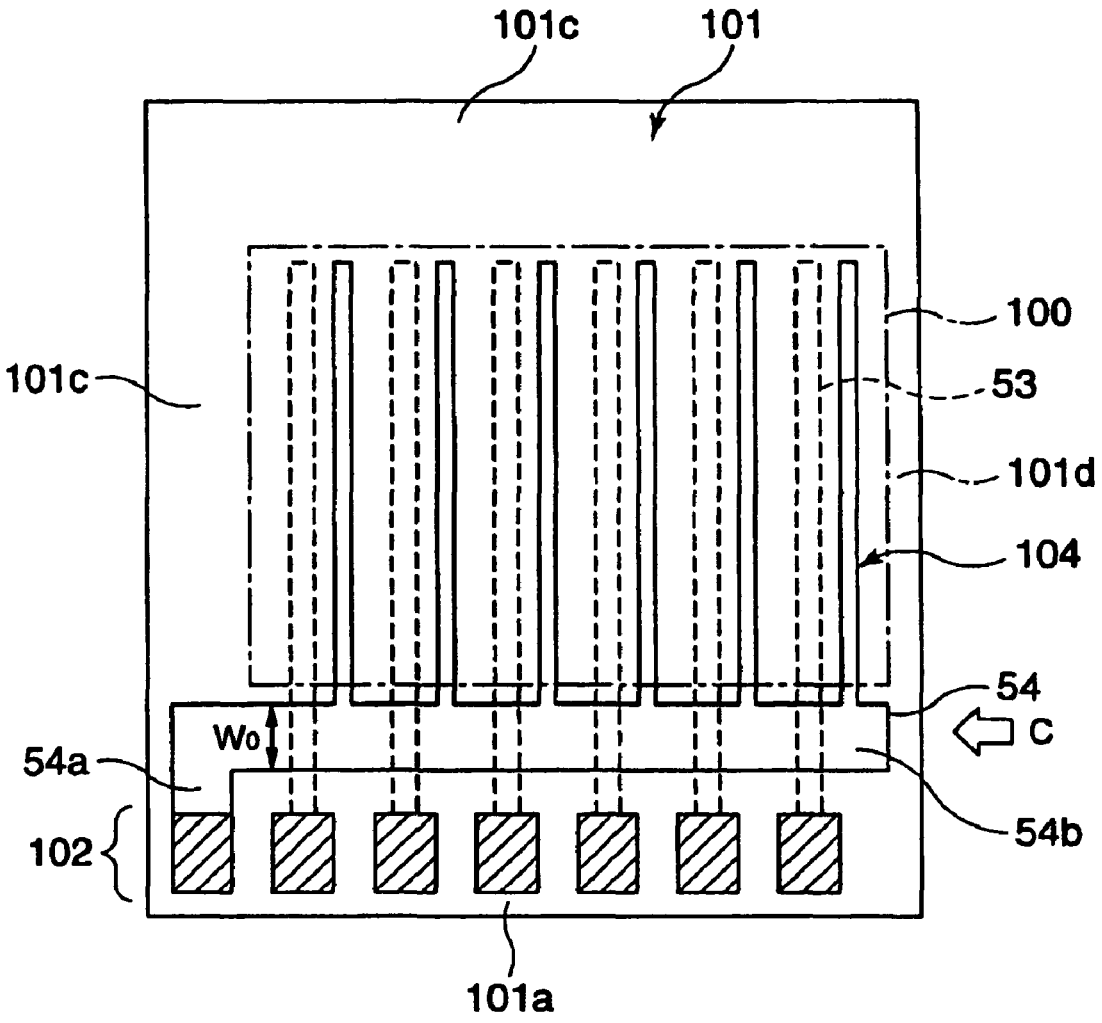
FIG. 1 is a schematic illustrating an electro-optical device according to a first exemplary embodiment.

FIG. 1 illustrates an electro-optical device according to a first exemplary embodiment of the present invention. In FIG. 1, the same reference numerals indicate the same elements as those of FIG. 18.

Figure 18:
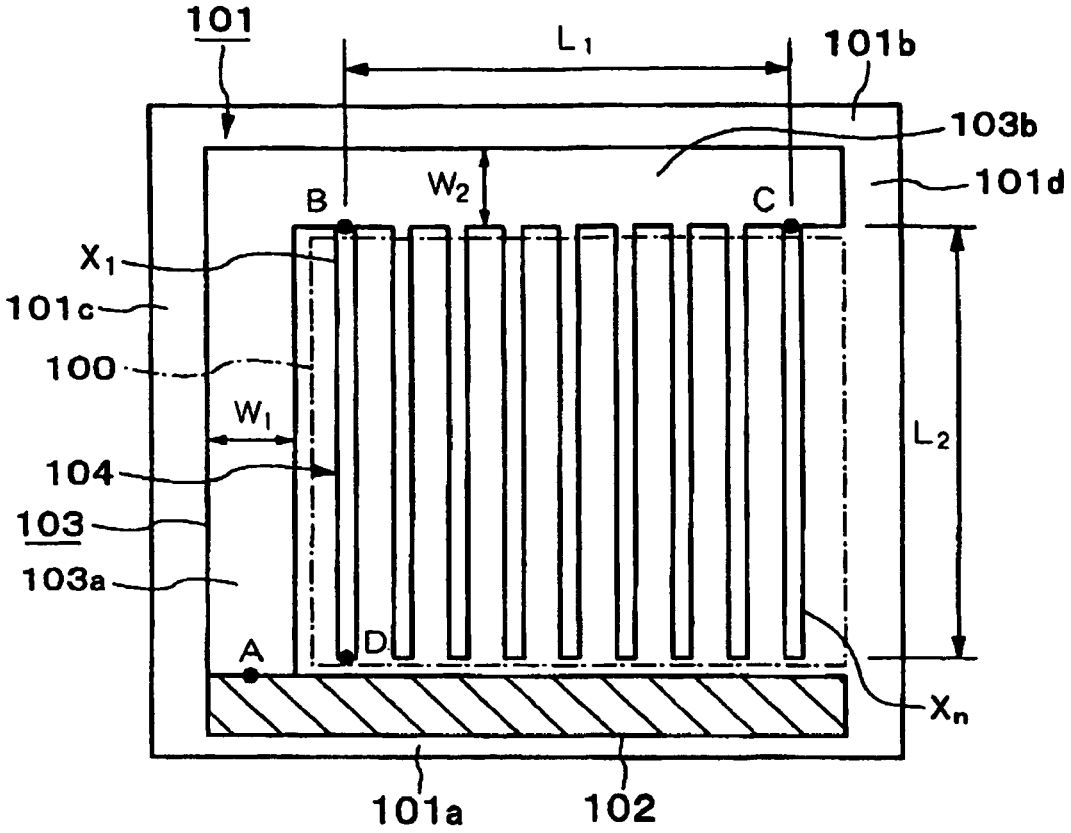
FIG. 18 is a schematic illustrating a related art electro-optical device.

The basic structure of the electro-optical device according to the present exemplary embodiment is almost the same as that of a related art electro-optical device illustrated in FIG. 18. However, the electro-optical device according to the present exemplary embodiment includes a second power source bus line 54 connected to a mounting terminal portion 102 connected to the first region 101a instead of the first power source bus line 103 illustrated in FIG. 18.

As illustrated in FIG. 1, the second power source bus line 54 includes one continuous conductive line and is made of a metal such as Al or AlSiCu. The second power source bus line 54 includes a first conductive portion 54a with one end connected to the connecting portion of the mounting terminal portion 102 and a supplying portion 54b connected to the first conductive portion 54a. The first conductive portion 54a is arranged in the first region 101a. Furthermore, all of the n power source lines 104 are connected from the supplying portion 54b to the current-drive elements. Conductive portions are not in a third region 101c and a fourth region 101d in this arrangement, where the second power source bus line 54 is in a region (the first region 101a) between the mounting terminal 102 and the matrix display portion 100. Therefore, it is possible to narrow the third region 101c and the fourth region 101d.

Second Exemplary Embodiment of Electro-Optical Device

Figure 2:
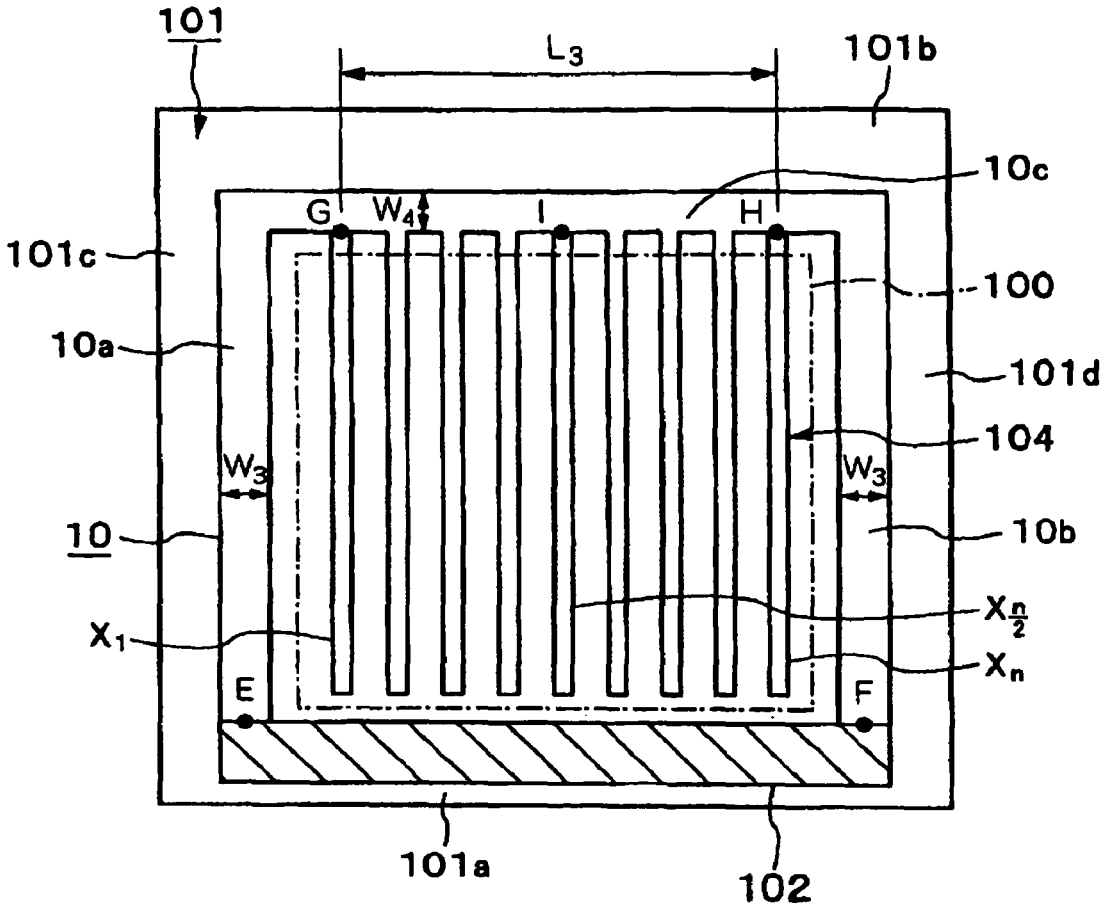
FIG. 2 is a schematic illustrating an electro-optical device according to a second exemplary embodiment.

FIG. 2 illustrates an electro-optical device according to a second exemplary embodiment of the present invention. In FIG. 2, the same reference numerals indicate the same elements as those of FIG. 18.

The basic structure of the electro-optical device according to the present exemplary embodiment is almost the same as that of the related electro-optical device illustrated in FIG. 18. However, the electro-optical device according to the present exemplary embodiment includes a third power source bus line 10 connected to the second to fourth regions 101b, 101c, and 101d and connected to the mounting terminal portion 102 in two places, instead of the first power source bus line 103 illustrated in FIG. 18.

As illustrated in FIG. 2, the third power source bus line 10 includes one continuous conductive line and is made of a metal such as Al or AlSiCu. The third power source bus line 10 includes a first conductive portion 10a whose both ends are connected to the connecting portion (not shown) of the mounting terminal portion 102 and which is arranged in the third region 101c, a second conductive portion 10b arranged in the fourth region 101d, and a supplying portion 10c connected to the first conductive portion 10a and to the second conductive portion 10b and arranged in the second region 101b. Both the first conductive portion 10a and the second conductive portion 10b have a section with width of $W_3$ and height of t. Furthermore, the supplying portion 10c has a section with width $W_4$ and height t. All of the n power source lines 104 are connected from the supplying portion 10c to the current-drive elements.

The width $W_3$ of both the first conductive portion 10a and the second conductive portion 10b, as illustrated in FIG. 18, is ½ of the width $W_1$ of the conductive portion 103a according to the related art. Furthermore, the width $W_4$ of the supplying portion 10c is ½ of the width $W_2$ of the supplying portion 103b according to the related art. The widths of the conductive portion and the supplying portion according to the present exemplary embodiment are made ½ of the widths of the conductive portion and the supplying portion of the related art because with this change the voltage drop does not increase, since current is supplied from both ends of the corresponding wiring line.

The driving current of the current-drive element has the mounting terminal portion 102 as a power source, passes through the first conductive portion 10a and the second conductive portion 10b of the third power source bus line 10, is led to the supplying portion 10c, is sent into the respective power source lines 104, and is supplied to the respective current-drive elements.

As illustrated in FIG. 2, in the case where the connection position between the mounting terminal portion 102 and the first conductive portion 10a is the point E, the connection position between the mounting terminal portion 102 and the second conductive portion 10b is the point F, the connection position between the power source line 104($X_1$) closest to the first conductive portion 10a and the supplying portion 10c is the point G, the connection position between the power source line 104Xn closest to the second conductive portion 10b and the supplying portion 10c is the point H, and the connection position between the power source line 104($X_{n/2}$) provided midway between the power source line 104($X_1$) and the power source line 104($X_n$) and the supplying portion 10c is the point I, the voltage values at the points E, F, G, H, and I are indicated as $V_E$, $V_F$, $V_G$, $V_H$, and $V_I$.

The width $W_3$ of both the first conductive portion 10a and the second conductive portion 10b is set to be ½ of the width $W_1$ of the conductive portion 103a illustrated in FIG. 18. The width $W_4$ of the supplying portion 10c is set to be ½ of the width $W_2$ of the supplying portion 104b as illustrated in FIG. 18. The voltage drop does not increase since the driving current supplied from the mounting terminal portion 102 to the first conductive portion 10a and the second conductive portion 10b is each ½ of the driving current supplied to the conductive portion 103a. Therefore, the voltage values $V_G$ and $V_H$ are equal to the voltage value $V_B$ illustrated in FIG. 18.

Figure 3:
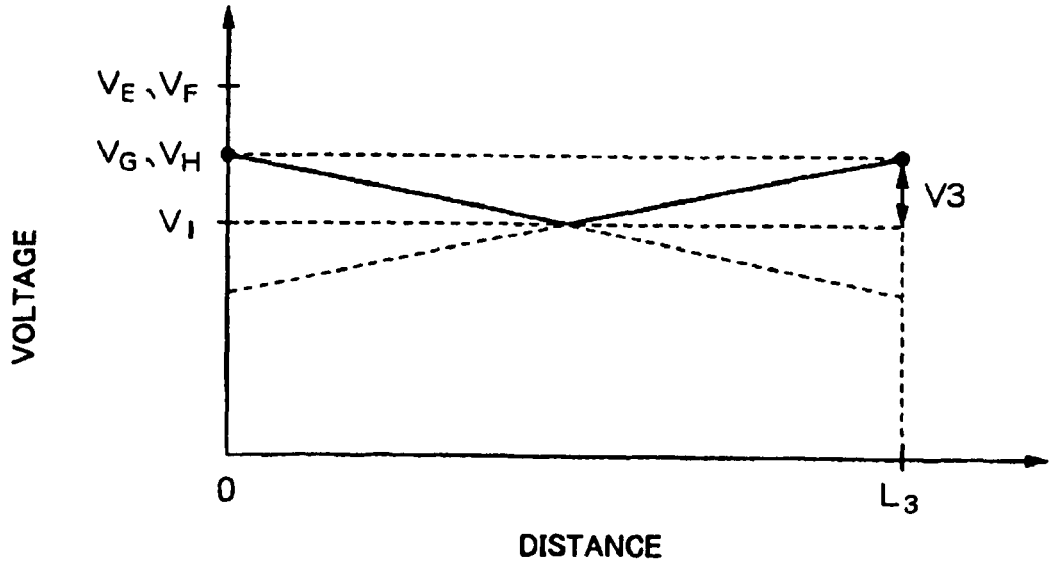
FIG. 3 illustrates variation in the voltage drop between the G point and the H point.

FIG. 3 illustrates variation in the voltage drop between the point G in FIG. 2 and the point H separated from the point G by the distance $L_3$. When the distance $L_3$ between the point G and the point H is equal to the distance $L_1$ between the point B and the point C as illustrated in FIG. 18, the slope of the voltage drop in FIG. 3 is equal to the slope of the voltage drop in FIG. 2. The resistance values here are double the resistance value of the related art illustrated in FIG. 18 and the current becomes ½ of the current of the related art illustrated in FIG. 18. That is, the voltage value $V_I$ at the point I of FIG. 2 is the minimum value of the voltage. An electric potential difference V3 between the maximum voltage value $V_G$ and $V_H$ and the minimum voltage value $V_I$ is ½ of an electric potential difference V1 in FIG. 19.

Therefore, when the shape of the related art first power source bus line 103 is compared to the shape of the third power source bus line 10 according to the present exemplary embodiment, the width $W_1$ of the conductive portion 103a that forms the first power source bus line 103 is equal to the total of the widths ($W_3$×2) of the first conductive portion 10a and the second conductive portion 10b that form the third power source bus line 10. The ratio of the width $W_4$ of the supplying portion 10c that forms the third power source bus line 10 with respect to the width $W_2$ of the supplying portion 103b that forms the first power source bus line 103 is $W_2/2$. Therefore, according to the present exemplary embodiment, it is possible to limit the voltage drop to ½ of the voltage drop according to the related art without widening the width of the power source bus line, that is, without widening the area of the frame portion 101 in which the power source bus line is arranged. That is, it is possible to reduce or prevent the deterioration of the display quality of the electro-optical device by reducing or preventing the brightness unevenness in the direction of the scanning line (not shown) and by making the unevenness of the brightness right-left symmetrical which makes unevenness difficult to be visually sensed.

Third Exemplary Embodiment of Electro-Optical Device

Figure 4:
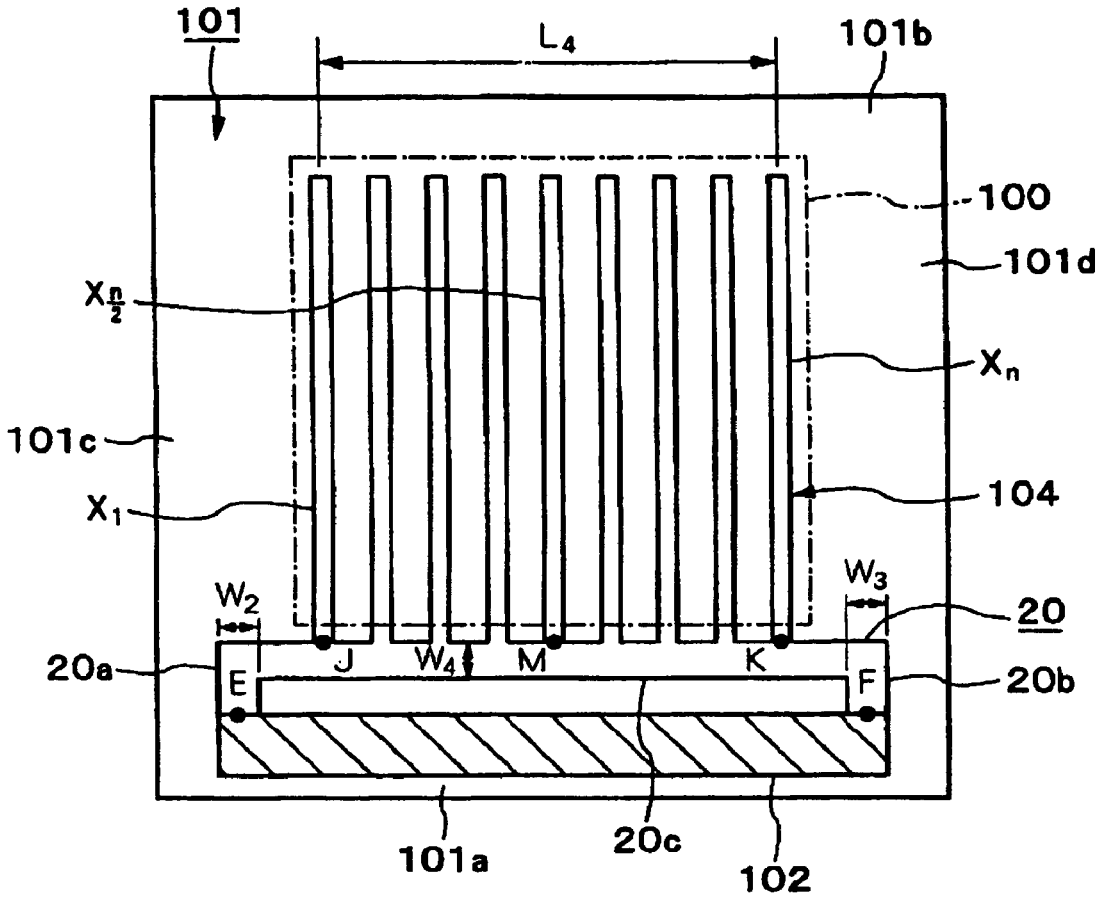
FIG. 4 is a schematic illustrating an electro-optical device according to a third exemplary embodiment.

FIG. 4 illustrates an electro-optical device according to a third exemplary embodiment of the present invention. In FIG. 4, the same reference numerals indicate the same elements as those of FIG. 2.

The basic structure of the electro-optical device according to the present exemplary embodiment is almost the same as that of the electro-optical device according to the second exemplary embodiment illustrated in FIG. 2. The electro-optical device according to the present exemplary embodiment includes a fourth power source bus line 20 arranged in the first region 101a and connected to the mounting terminal portion 102 in two places instead of the third power source bus line 10 illustrated in FIG. 2.

As illustrated in FIG. 4, a fourth power source bus line 20 includes one continuous conductive line and is made of a metal such as Al or AlSiCu. Further, the fourth power source bus line 20 has both ends connected to a connecting portion (not shown) of the mounting terminal portion 102, and includes a first conductive portion 20a arranged in the first region 101a and a second conductive portion 20b and a supplying portion 20c connected to the first conductive portion 20a and the second conductive portion 20b. Both the first conductive portion 20a and the second conductive portion 20b have a section with width of $W_3$ and height of t. Furthermore, the supplying portion 20c has a section with width of $W_4$ and height of t. All of the n power source lines 104 are connected from the supplying portion 20c to the current-drive elements.

The width $W_3$ of both the first conductive portion 20a and the second conductive portion 20b, as in the second embodiment, is ½ of the width $W_1$ of the conductive portion 103a according to the related art. Furthermore, the width $W_4$ of the supplying portion 20c is ½ of the width $W_2$ of the supplying portion 103b according to the related art. The width of both the conductive portion and the supplying portion according to the present exemplary embodiment are made ½ of the respective widths of the conductive portion and the supplying portion of related art because despite this change the voltage drop does not increase since current is supplied from both ends of the corresponding wiring line.

The driving current of the current-driven element has the mounting terminal portion 102 as a power source passes through the first conductive portion 20a and the second conductive portion 20b of the fourth power source bus line 20, is led to the supplying portion 20c, is sent into the respective power source lines 104, and is supplied to the respective current-drive elements.

As illustrated in FIG. 4, in the case where the connection position between the power source line 104($X_1$) closest to the first conductive portion 20a and the supplying portion 20c is the point J, the connection position between the power source line 104($X_n$) closest to the second conductive portion 20b and the supplying portion 20c is the point K, and the connection position between the power source line 104($X_{n/2}$) provided midway between the power source line 104($X_1$) and the power source line 104($X_n$) and the supplying portion 20c is the point M, the voltage values at the points J, K, and M are indicated as $V_J$, $V_K$, and $V_M$.

Figure 5:
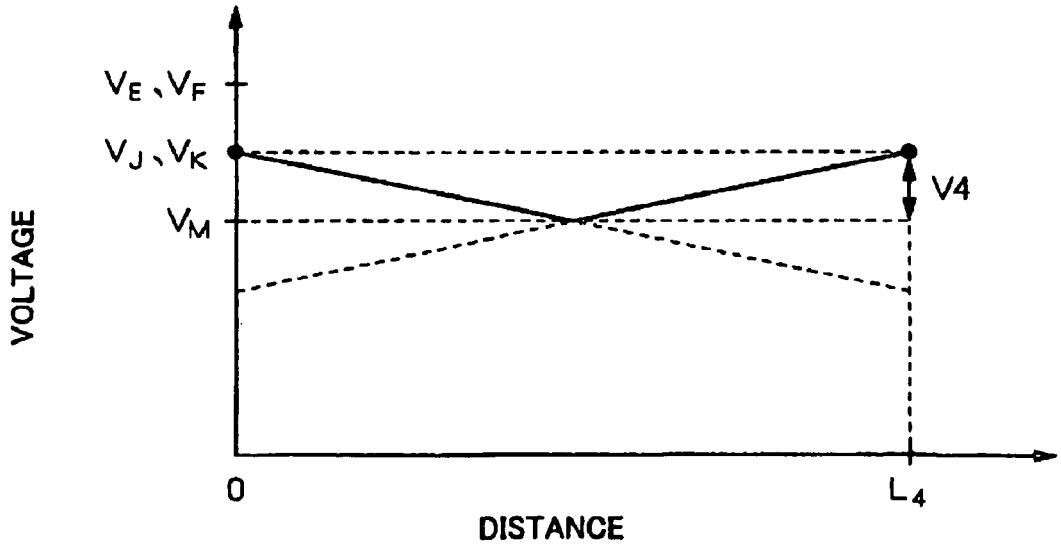
FIG. 5 illustrates variation in the voltage drop between the J point and the K point.

FIG. 5 illustrates the variation of the voltage drop between the point J in FIG. 4 and the point K separated from the point J by the distance $L_4$. When the distance $L_4$ between the point J and the point K is equal to the distance $L_1$ between the point B and the point C illustrated in FIG. 18, the slope of the voltage drop in FIG. 5 is equal to the slope of the voltage drop in FIG. 3. This is because the resistance according to the present exemplary embodiment doubles the resistance according to the related art illustrated in FIG. 18 and thus the current according to the present exemplary embodiment is ½ of the current according to the related art illustrated in FIG. 18. That is, the voltage values $V_J$, $V_K$, and $V_M$ are different from the voltage values $V_G$, $V_H$, and $V_I$ in FIG. 3. However, the voltage value $V_M$ at the point M of FIG. 4 is the minimum value of the voltage, and an electric potential difference V4 between the maximum voltage value $V_J$ and $V_K$ is ½ of the electric potential difference V1 in FIG. 19.

Therefore, comparing the shape of the related art first power source bus line 103 to the shape of the fourth power source bus line 20 of the present exemplary embodiment, the width $W_1$ of the conductive portion 103a that forms the first power source bus line 103 is equal to the total width ($W_3$×2) of the first conductive portion 20a and the second conductive portion 20b that form the fourth power source bus line 20. The width $W_4$ of the supplying portion 20c that forms the fourth power source bus line 20 is ½ the width $W_2$ ($W_2$/2) of the supplying portion 103b that forms the first power source bus line 103. Therefore, according to the present exemplary embodiment, it is possible to limit the voltage drop to about ½ of the voltage drop according to the related art without widening the width of the power source bus line, that is, without widening the area of the frame portion 101, in which the power source bus line is arranged. That is, it is possible to prevent the deterioration of the display quality of the electro-optical device by preventing the brightness unevenness in the direction of the scanning line (not shown) and making the brightness unevenness right-left symmetrical, which makes unevenness difficult to be visually sensed.

Fourth Exemplary Embodiment of Electro-Optical Device

Figure 6:
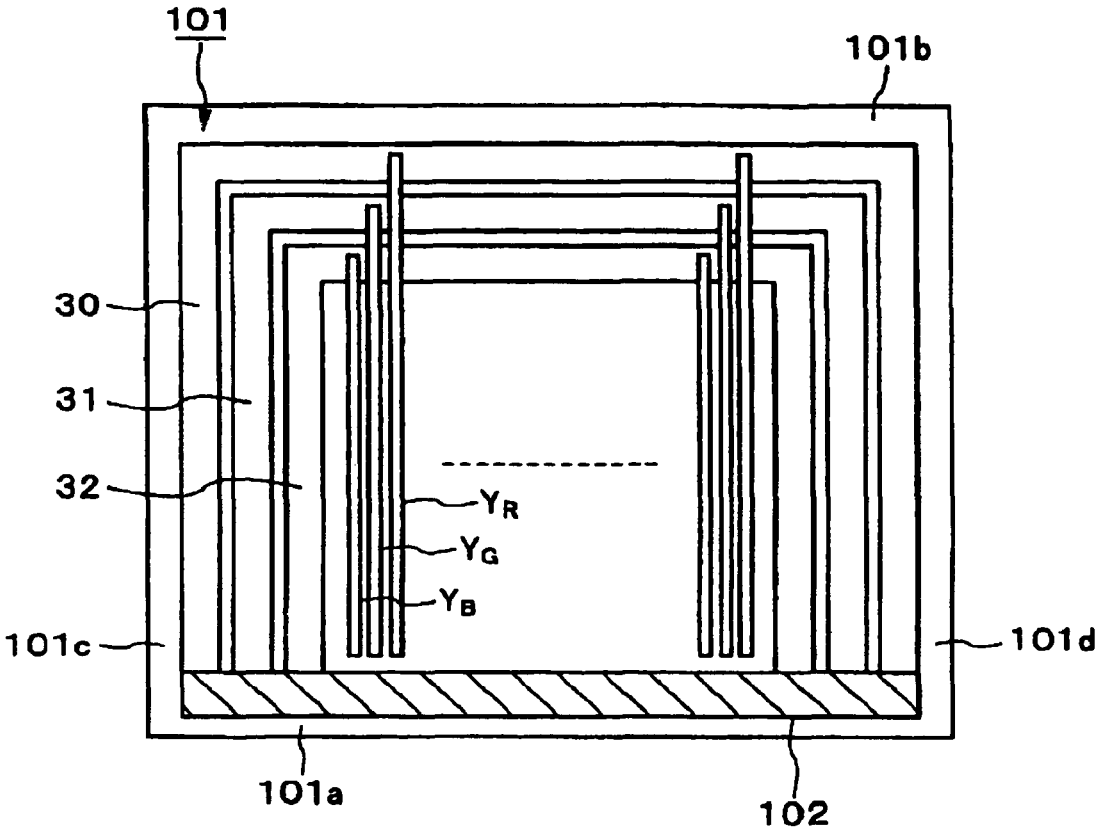
FIG. 6 is a schematic illustrating an electro-optical device according to a fourth exemplary embodiment.

FIG. 6 illustrates an electro-optical device according to a fourth exemplary embodiment of the present invention. In FIG. 6, the same reference numerals indicate the same elements as those of FIGS. 2 and 4.

According to the second and third exemplary embodiments, only one power source bus line is provided in the frame portion 101 for the red, green, and blue current-driven elements (not shown). However, the electro-optical device according to the present exemplary embodiment includes the power source bus lines for respective red, green, and blue current-driven elements.

As illustrated in FIG. 6, the three power source bus lines are connected to the second through fourth regions 101b, 101c, and 101d and are connected parallel to each other at the two positions of the mounting terminal portions 102. That is, the electro-optical device includes a fifth power source bus line 30 for the red current-drive element, a sixth power source bus line 31 for the green current-drive element, and a seventh power source bus line 32 for the blue current-drive element.

Figure 7:
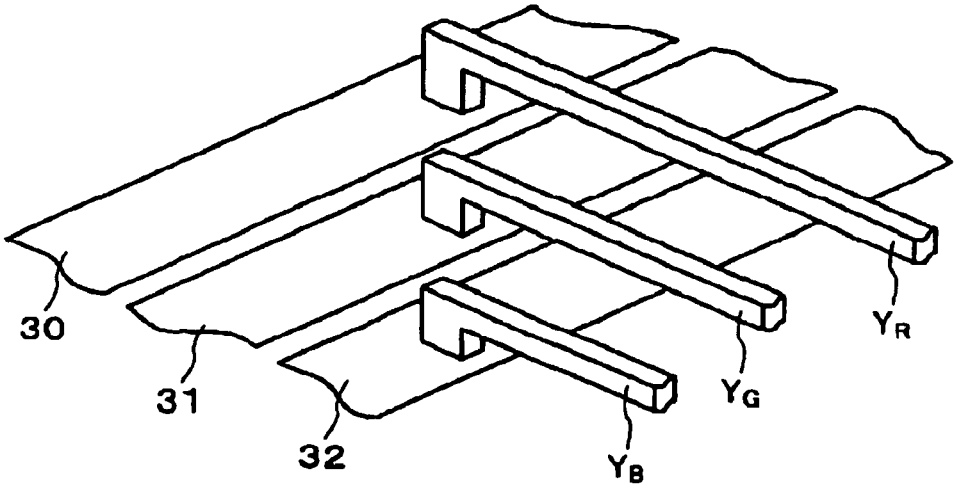
FIG. 7 is a perspective view illustrating a connection portion connecting a power source line and a power source bus line.

A plurality of power source lines $Y_R$, $Y_G$, and $Y_B$ is connected to the fifth to seventh power source bus lines 30, 31, and 32, respectively. As illustrated in FIG. 7, the power source line $Y_R$ is wired so as to cross over the sixth and seventh power source bus lines 31 and 32. The power source line $Y_G$ is wired so as to cross over the seventh power source bus line 32. The power source line $Y_B$ is wired so as to be in the same layer as the power source line $Y_R$ and the power source line $Y_G$.

According to the present exemplary embodiment, it is possible to obtain the same effects as those of the second exemplary embodiment. Furthermore, because current is supplied from the respective independent power source bus lines to the respective colors, red, green, and blue current-driven elements, it is possible to appropriately correct the current supplied to the respective colors, red, green, and blue current-driven elements and to obtain an electro-optical device with excellent efficiency and small display irregularity.

Fifth Exemplary Embodiment of Electro-Optical Device

Figure 8:
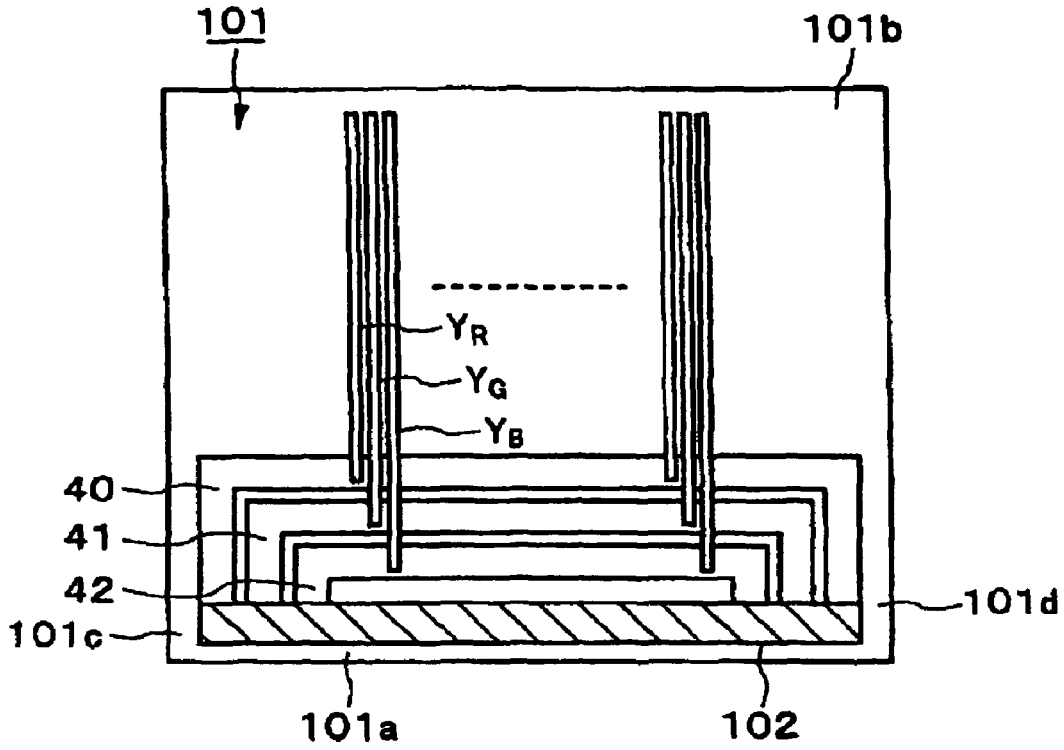
FIG. 8 is a schematic illustrating an electro-optical device according to a fifth exemplary embodiment.

FIG. 8 illustrates an electro-optical device according to a fifth exemplary embodiment of the present invention. In FIG. 8, the same reference numerals indicate the same elements as those of FIGS. 2, 4, and 6.

The electro-optical device according to the present exemplary embodiment, like in the fourth exemplary embodiment illustrated in FIG. 6, includes three power source bus lines corresponding to the respective red, green, and blue current-driven elements. However, all of the power source bus lines are arranged in the first region 101a. The three power source bus lines are connected parallel to each other at two parts of the mounting terminal portion 102. That is, the electro-optical device includes an eighth power source bus line 40 for the red current-drive element, a ninth power source bus line 41 for the green current-drive element, and a tenth power source bus line 42 for the blue current-drive element.

The plurality of power source lines $Y_R$, $Y_G$, and $Y_B$ is connected to the eighth through tenth power source bus lines 40, 41, and 42, respectively. The power source lines are wired with respect to the power source bus lines, respectively, like in the fourth exemplary embodiment illustrated in FIG. 7. According to the present exemplary embodiment, it is possible to obtain the same effects as those of the fourth exemplary embodiment.

Sixth Exemplary Embodiment of Electro-Optical Device

Figure 9:
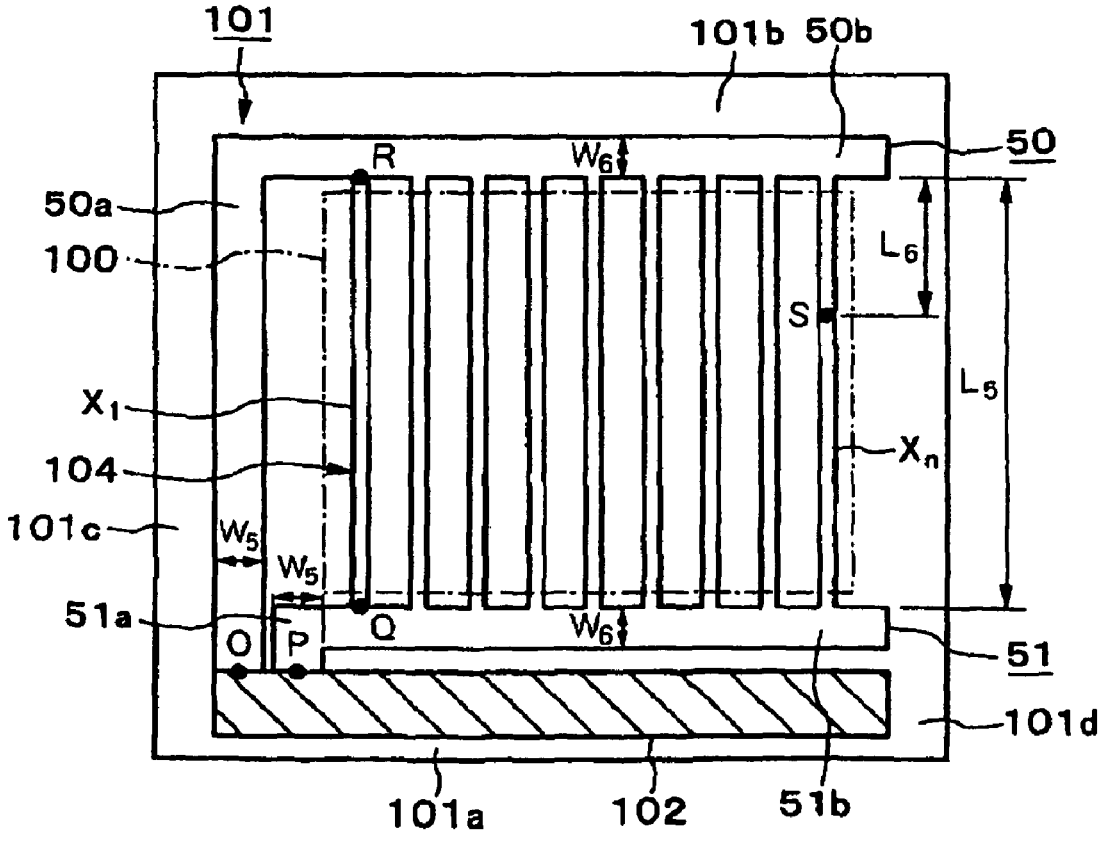
FIG. 9 is a schematic illustrating an electro-optical device according to a sixth exemplary embodiment.

FIG. 9 illustrates an electro-optical device according to a sixth exemplary embodiment of the present invention. In FIG. 9, the same reference numerals indicate the same elements as those of FIGS. 2 and 4.

The basic structure of the electro-optical device according to the present exemplary embodiment is almost the same as that of the related art electro-optical device illustrated in FIG. 18. However, the electro-optical device according to the present exemplary embodiment includes an eleventh power source bus line 50 arranged continuously in the second and third regions 101b and 101c with one end connected to the mounting terminal portion 102 and a twelfth power source bus line 51 arranged in the first region 101a with one end connected to the mounting terminal portion 102, instead of the first power source bus line 103 illustrated in FIG. 18.

The eleventh and twelfth power source bus lines 50 and 51 are made of a metal such as Al or AlSiCu. As illustrated in FIG. 9, the eleventh power source bus line 50 includes a conductive portion 50a arranged in the third region 101c and a supplying portion 50b connected to the conductive portion 50a and arranged in the second region 101b. The twelfth power source bus line 51 includes a conductive portion 51a arranged in the first region 101a and a supplying portion 51b connected to the conductive portion 51a and arranged in the first region 101a. The conductive portion 51a is connected to the mounting terminal portion 102 from the third region 101c so as to be adjacent and parallel to the conductive portion 50a of the eleventh power source bus line 50.

Both the conductive portions 50a and 51a have a section with the width $W_5$ and the height t. Furthermore, both the supplying portions 50b and 51b have a section with the width $W_6$ and the height t. Each of the n power source lines 104 has one end connected to the supplying portion 50b and the other end connected to the supplying portion 51b. The respective power source lines 104 are connected to the current-drive elements.

The width $W_5$ of the conductive portions 50a and 51a is ½ of the width $W_1$ of the conductive portion 103a of the related art as illustrated in FIG. 18. Furthermore, the width $W_6$ of the supplying portions 50b and 51b is ½ of the width $W_2$ of the supplying portion 103b of the related art. The widths of the conductive portions and the supplying portions according to the present exemplary embodiment are made ½ of the respective widths of the conductive portions and the supplying portions of the related art because despite this change the voltage drop does not increase since current is supplied from both ends of the corresponding wiring line.

The driving current of the current-drive element has the mounting terminal portion 102 as a power source, passes through the conductive portion 50a of the eleventh power source bus line 50, is led to the supplying portion 50b, and is sent into the respective power source lines, and also passes through the conductive portion 51a of the twelfth power source bus line 51 and is led to the supplying portion 51b, and is sent into the respective power source lines 104, and both are supplied to the respective current-drive elements.

As illustrated in FIG. 9, in the case where a connection position between the mounting terminal portion 102 and the conductive portion 50a is the point O, a connection position between the mounting terminal portion 102 and the conductive portion 51a is the point P, a connection position between the power source line 104($X_1$) closest to the conductive portion 50a and the supplying portion 50b is the point Q, and a connection position between the power source line 104 ($X_1$) and the supplying portion 51b is the point R, the voltage values of the points 0, P, Q, and R are indicated as $V_O$, $V_P$, $V_Q$, and $V_R$.

Figure 19:
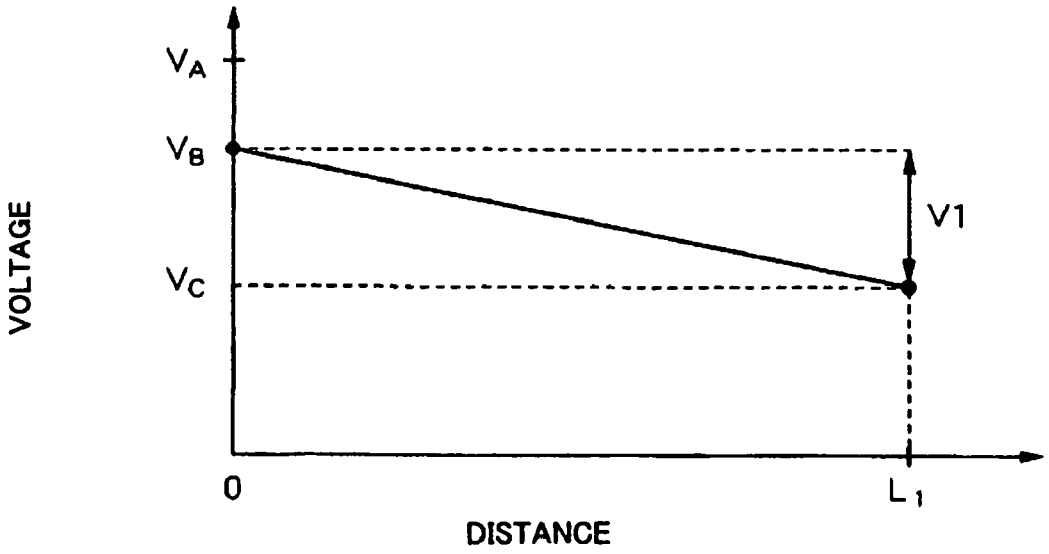
FIG. 19 illustrates the voltage drop between the point B and the point C.

The width $W_5$ of each of the conductive portions 50a and 51a is set to be ½ the width $W_1$ of the conductive portion 103a as illustrated in FIG. 18. The width $W_6$ of the supplying portions 50b and 51b is set to be ½ the width $W_2$ of the supplying portion 103b illustrated in FIG. 18 because the voltage drop does not increase despite this change, since the driving current supplied from the mounting terminal portion 102 to the conductive portion 50a or the conductive portion 51a is ½ of the driving current supplied to the conductive portion 103a. Therefore, the voltage value $V_Q$ is equal to the voltage value $V_B$ as illustrated in FIG. 19. Since the distance between the point R and the mounting terminal portion 102 is shorter than the distance between the point Q and the mounting terminal portion 102, the voltage value $V_R$ is higher than the voltage value $V_Q$.

Figure 10:
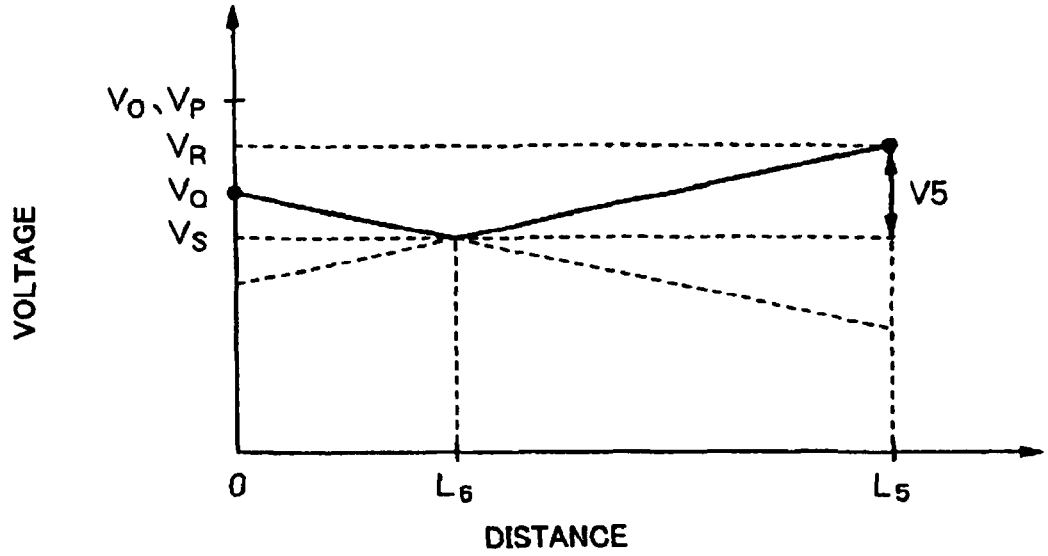
FIG. 10 illustrates the voltage drop between supplying portions 50b and 51b.
Figure 20:
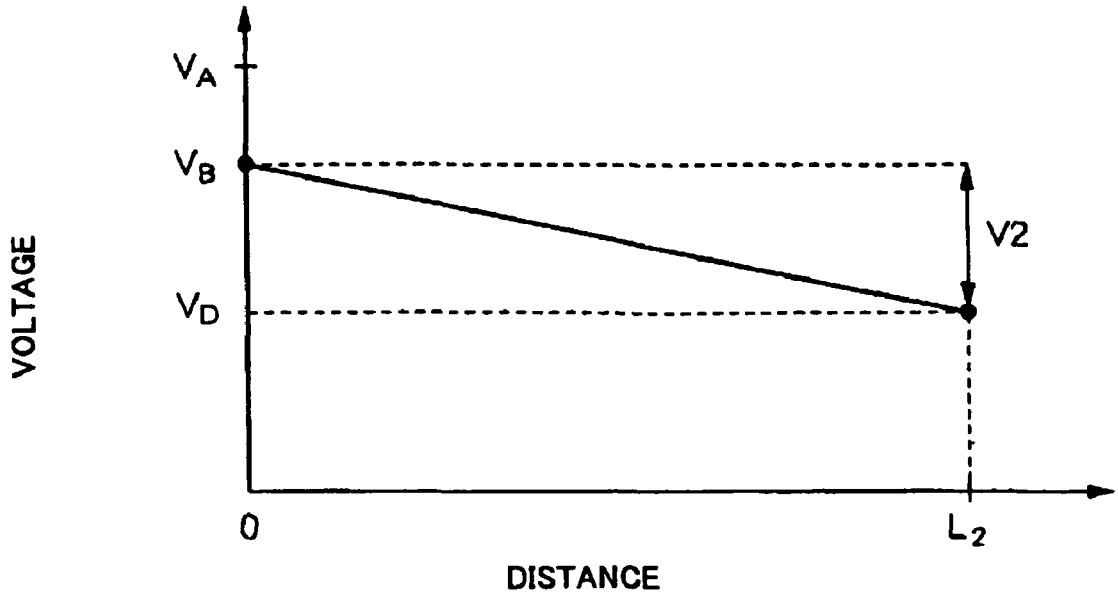
FIG. 20 illustrates the voltage drop between the point B and the point D.

FIG. 10 illustrates the variation of the voltage drop between the supplying portion 50b and the supplying portion 51b separated from the supplying portion 50b by the distance $L_5$. When the distance $L_5$ between the supplying portion 50b and the supplying portion 51b is equal to the distance $L_2$ between the point B and the point D, which is illustrated in FIG. 18, the slope of the voltage drop in FIG. 10 is equal to the slope of the voltage drop in FIG. 18. That is, when the intersection of two inclined lines of FIG. 10 is at distance $L_6$, the point on the power source line 104($X_n$) remotest from the conductive portion 50a which is $L_6$ from the supplying portion 50b is the point S and the voltage value at the point S is $V_S$, the voltage value $V_S$ is the minimum voltage value. The electric potential difference V5 between the voltage value $V_R$ and the voltage value $V_S$ is about ½ of the electric potential difference V2 in FIG. 20.

Therefore, when the shape of the related art first power source bus line 103 is compared to the shape of each of the eleventh and twelfth power source bus lines 50 and 51 according to the present exemplary embodiment, the width $W_5$ of the conductive portion 50a that forms the eleventh power source bus line 50 is ½ of the width $W_1$ of the conductive portion 103a that forms the first power source bus line 103. The total width ($W_6$×2) of the supplying portion 50b and the supplying portion 51b is equal to the width $W_2$ of the supplying portion 103b that forms the first power source bus line 103. Therefore, according to the present exemplary embodiment, it is possible to reduce the voltage drop to about ½ of the voltage drop according to the related art without widening the width of the power source bus line, that is, without widening the area of the frame portion 101 in which the power source bus line is arranged. That is, it is possible to reduce or prevent the deterioration of the display quality of the electro-optical device by reducing or preventing the brightness unevenness in the direction of the scanning line (not shown) and by making the unevenness of the brightness right-left symmetrical which makes unevenness difficult to visually sense.

Seventh Exemplary Embodiment of Electro-Optical Device

Figure 11:
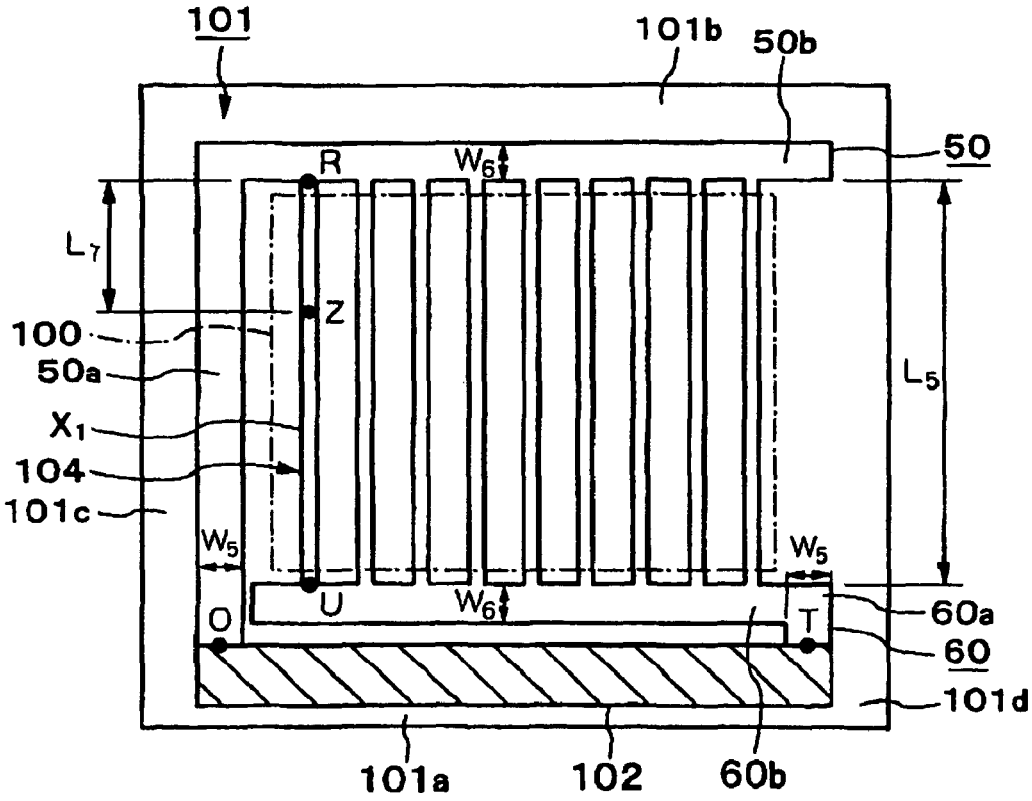
FIG. 11 is a schematic illustrating an electro-optical device according to a seventh exemplary embodiment.

FIG. 11 illustrates an electro-optical device according to a seventh exemplary embodiment of the present invention. In FIG. 11, the same reference numerals indicate the same elements as those of FIG. 9.

The basic structure of the electro-optical device according to the present exemplary embodiment is almost the same as that of the electro-optical device according to the sixth exemplary embodiment illustrated in FIG. 9. However, the electro-optical device according to the present exemplary embodiment includes a thirteenth power source bus line 60 having a conductive portion 60a connected parallel to the conductive portion 50a of the eleventh power source bus line 50 and connected from the fourth region 101d to the mounting terminal portion 102, instead of the twelfth power source bus line 51 illustrated in FIG. 9.

The thirteenth power source bus line 60 is made of a metal such as Al or AlSiCu. As illustrated in FIG. 11, the thirteenth power source bus line 60 includes a conductive portion 60a arranged in the first region 101a and a supplying portion 60b connected to the conductive portion 60a and arranged in the first region 101a.

The conductive portion 60a has a section with the width $W_5$ and the height t similar to those of the conductive portions 50a and 51a. Furthermore, the supplying portion 60b has a section with the width $W_6$ and the height t similar to those of the supplying portions 50b and 51b. All of the n power source lines 104 have one end connected to the supplying portion 50b and the other end connected to the supplying portion 60b. Therefore, the respective power source lines 104 are connected to the current-drive elements.

The driving current of the current-drive element has the mounting terminal portion 102 as a power supply, passes through the conductive portion 50a of the eleventh power source bus line 50 is led to the supplying portion 50b, and is sent into the respective power source lines 104, and also similarly passes through the conductive portion 60a of the thirteenth power source bus line 60, is led to the supplying portion 60b, and is sent into the respective power source lines 104, and both are supplied to the respective current-driven elements.

As illustrated in FIG. 11, in the case where the connection position between the mounting terminal portion 102 and the conductive portion 60a is the point T and a connection position between the power source line 104($X_1$) and the supplying portion 60b is the point U, the voltage values at the point T and the point U are indicated as $V_T$ and $V_U$, respectively.

The width $W_5$ of the conductive portions 50a and 60a is set to be ½ the width $W_1$ of the conductive portion 103a illustrated in FIG. 18, and the width $W_6$ of the supplying portions 50b and 60b is set to be ½ the width $W_2$ of the supplying portion 104b illustrated in FIG. 18 because the voltage drop does not increase despite this change since the driving current supplied from the mounting terminal portion 102 to the conductive portion 50a or the conductive portion 60a is ½ of the driving current supplied to the conductive portion 103a. Therefore, the voltage value $V_R$ is equal to the voltage value $V_B$ illustrated in FIG. 19. Since the distance between the mounting terminal portion 102 and the point U is shorter than the distance between the mounting terminal portion 102 and the point R, the voltage value $V_U$ is higher than the voltage value $V_R$.

Figure 12:
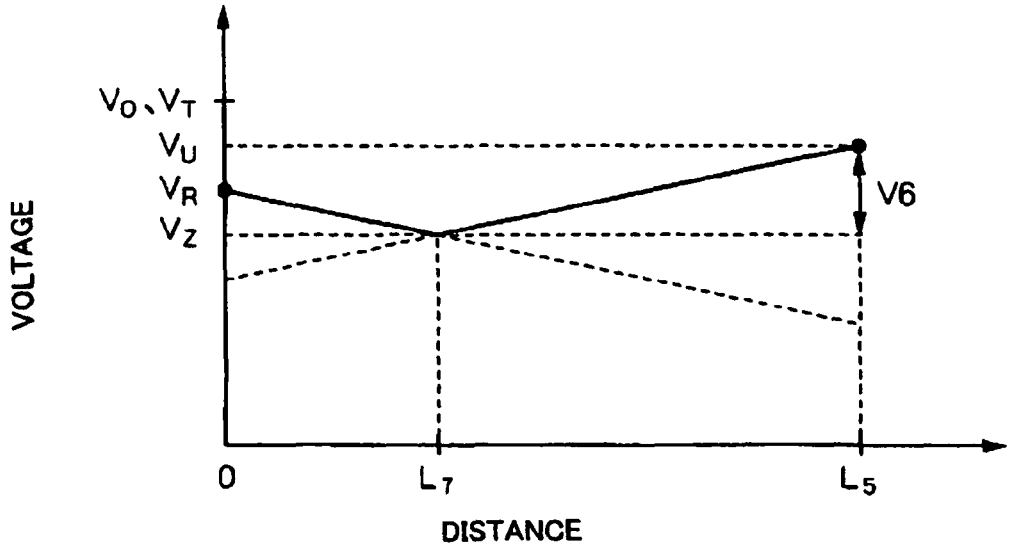
FIG. 12 illustrates the voltage drop between supplying portions 50b and 60b.

FIG. 12 illustrates the variation of the voltage drop between the supplying portion 50b and the supplying portion 60b separated from the supplying portion 50b by the distance $L_5$. When the distance $L_5$ between the supplying portion 50b and the supplying portion 60b is equal to the distance $L_2$ between the point B and the point D, which is illustrated in FIG. 18, the slope of the voltage drop in FIG. 12 is equal to the slope of the voltage drop in FIG. 18. That is, when the intersection of the two inclined lines of FIG. 12 is the distance $L_7$, and the point on the power source line 104($X_1$) $L_7$ from the supplying portion 50b is the point Z and the voltage value at the point Z is $V_Z$, the voltage value $V_Z$ is the minimum value of the voltage. An electric potential difference V6 between the voltage value $V_U$ and the voltage value $V_Z$ is about ½ of the electric potential difference V2 in FIG. 20.

Therefore, according to the present invention, it is possible to reduce the voltage drop to about ½ of that according to the related art without widening the power source bus line, that is, without widening the area of the frame portion 101 in which the power source bus line is arranged, as in the sixth exemplary embodiment.

That is, it is possible to reduce or prevent the deterioration of the display quality of the electro-optical device by reducing or preventing the brightness unevenness in the direction of the scanning line (not shown) and by making the brightness unevenness left-right symmetrical which makes unevenness difficult to visually sense.

Eighth Exemplary Embodiment of Electro-Optical Device

Figure 13:
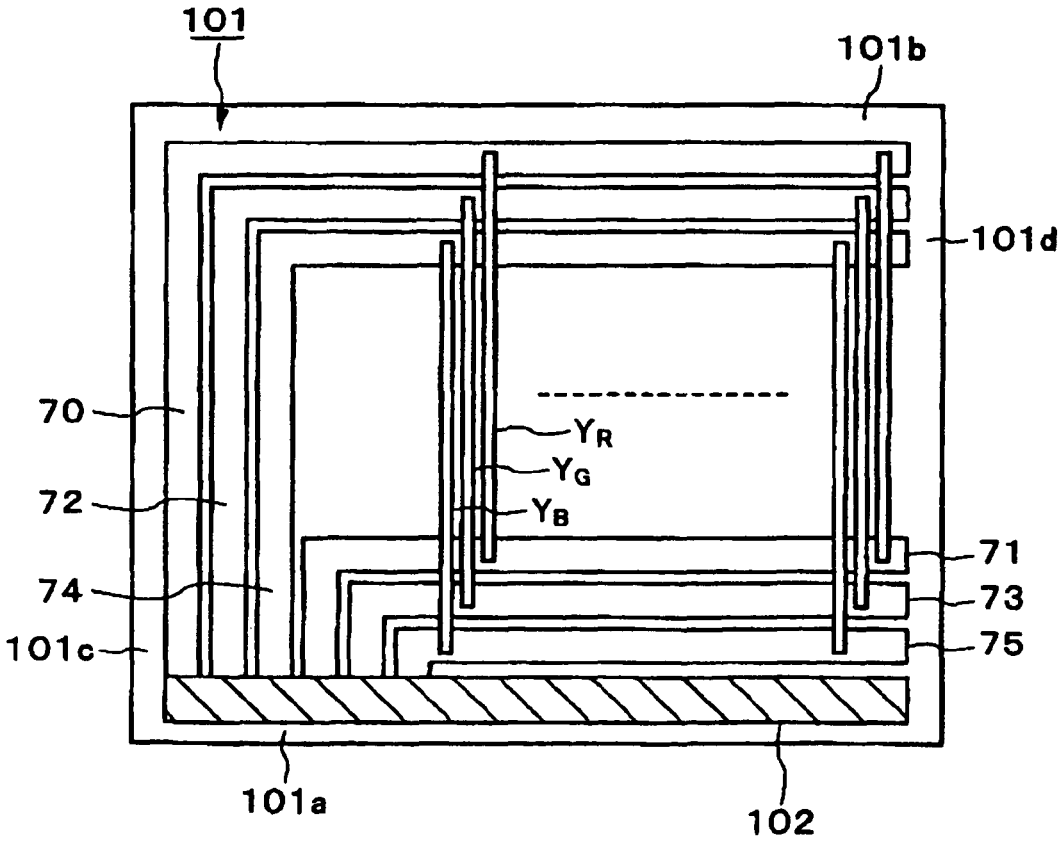
FIG. 13 is a schematic illustrating an electro-optical device according to an eighth exemplary embodiment.

FIG. 13 illustrates an electro-optical device according to an eighth exemplary embodiment of the present invention. In FIG. 13, the same reference numerals indicate the same elements as those of FIGS. 6, 7, 9, and 11.

According to the sixth and seventh exemplary embodiments, only one group of power source bus lines corresponding to all of the red, green, and blue current-driven elements (not shown) is provided in the frame portion 101. However, the electro-optical device according to the present exemplary embodiment includes the power source bus lines corresponding to the respective red, green, and blue current-driven elements.

As illustrated in FIG. 13, the electro-optical device includes a fourteenth power source bus line 70 and a fifteenth power source bus line 71 for the red current-driven element, a sixteenth power source bus line 72 and a seventeenth power source bus line 73 for the green current-driven element, and an eighteenth power source bus line 74 and a nineteenth power source bus line 75 for the blue current-driven element.

The fourteenth power source bus line 70 and fifteenth power source bus line 71, the sixteenth power source bus line 72 and seventeenth power source bus line 73, and the eighteenth power source bus line 74 and nineteenth power source bus line 75 are connected by the plurality of power source lines $Y_R$, $Y_G$, and $Y_B$ respectively. The respective power source lines are wired in the respective power source bus lines as in the fourth exemplary embodiment illustrated in FIG. 7. The fifteenth, seventeenth, and nineteenth power source bus lines 71, 73, and 75 are connected from the third region 101c to the mounting terminal portion 102 as in the sixth exemplary embodiment.

According to the present exemplary embodiment, it is possible to obtain the same effects as those of the sixth exemplary embodiment. Furthermore, because current is supplied from the independent power source bus lines to the respective red, green, and blue current-driven elements, it is possible to appropriately control the current supplied to the respective red, green, and blue current-driven elements and to obtain an electro-optical device with excellent efficiency and a small display irregularity.

Ninth Exemplary Embodiment of Electro-Optical Device

Figure 14:
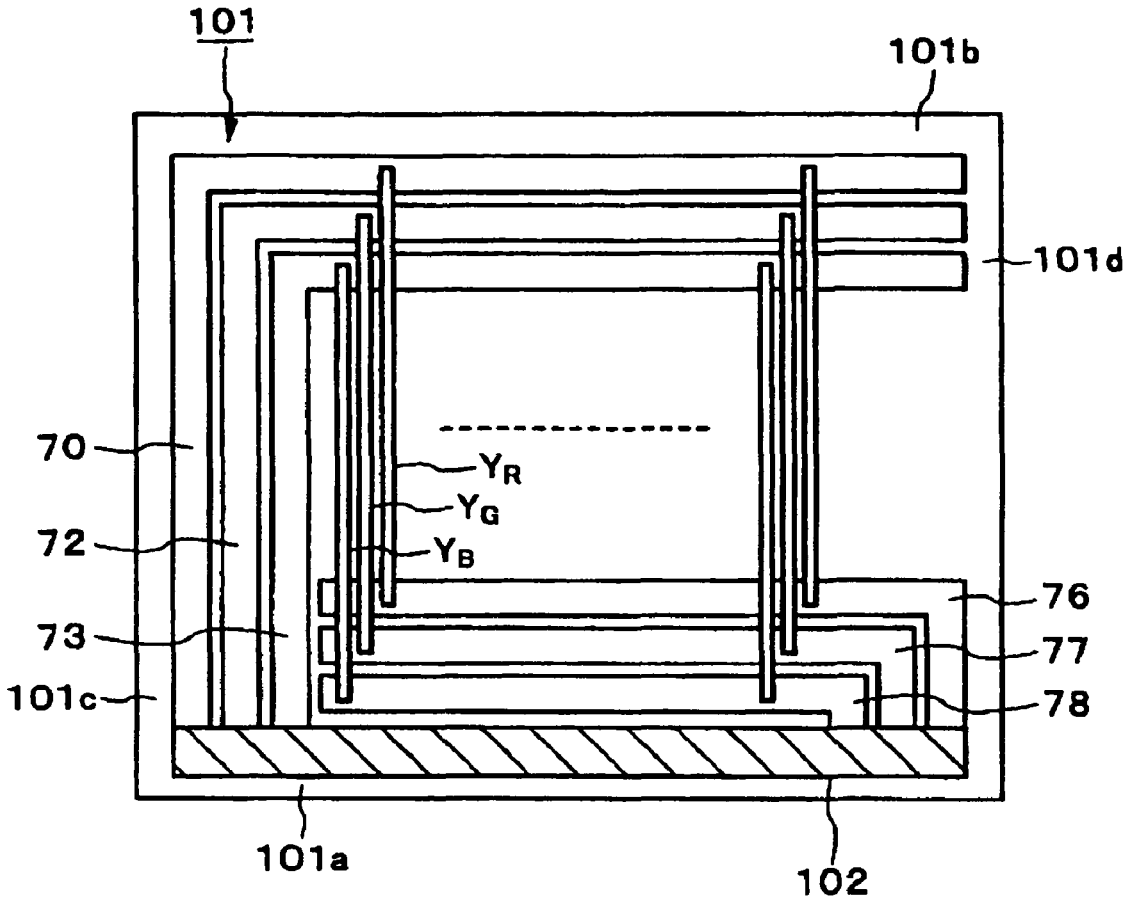
FIG. 14 is a schematic illustrating an electro-optical device according to a ninth exemplary embodiment.

FIG. 14 illustrates an electro-optical device according to a ninth exemplary embodiment of the present invention. In FIG. 14, the same reference numerals indicate the same elements as those of FIGS. 9, 11, and 13.

The electro-optical device according to the present exemplary embodiment, as in the eighth exemplary embodiment illustrated in FIG. 13, has three groups of power source bus lines corresponding to the current-driven elements of the three colors, red, green, and blue. However, twentieth, twenty first and twenty second power source bus lines 76, 77, and 78 arranged in the first region 101a are connected from the fourth region 101d to the mounting terminal portion 102 as in the seventh exemplary embodiment. Therefore, according to the present exemplary embodiment, it is possible to obtain almost the same effects as those of the seventh exemplary embodiment.

Tenth Exemplary Embodiment of Electro-Optical Device

Figure 21:
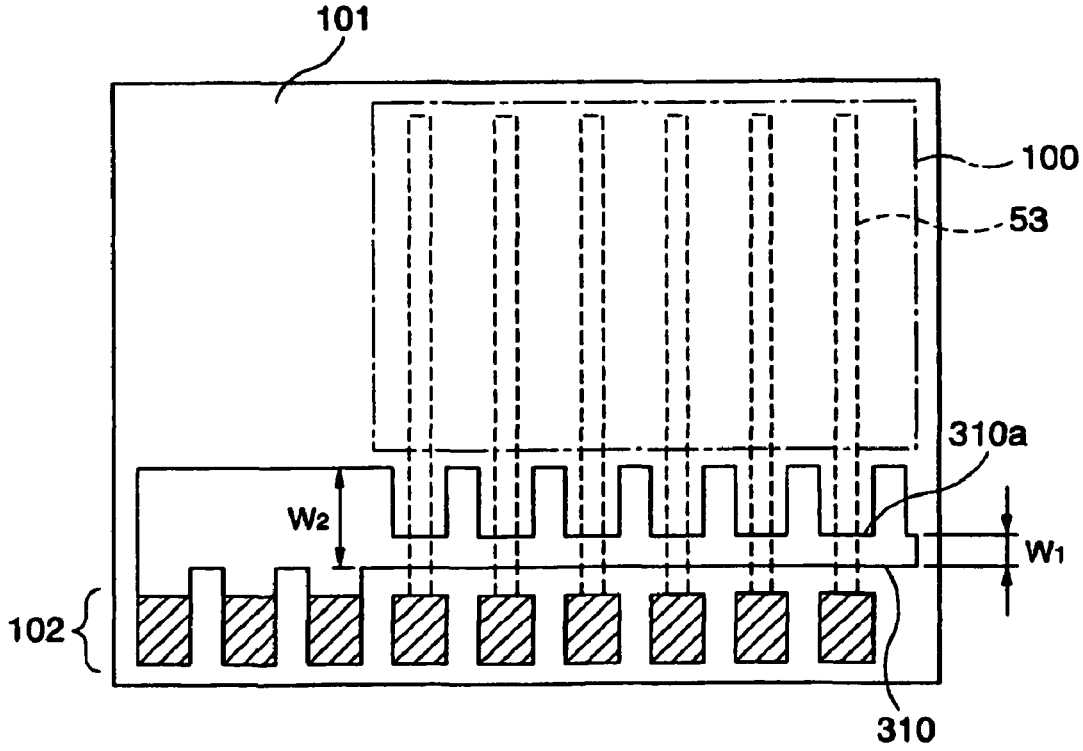
FIG. 21 is a schematic plan view illustrating an electro-optical device according to a tenth exemplary embodiment of the present invention.

FIG. 21 illustrates an electro-optical device according to a tenth exemplary embodiment of the present invention. In FIG. 21, the same reference numerals indicate the same elements as those of the electro-optical device according to the first exemplary embodiment illustrated in FIG. 1.

The electro-optical device according to the present exemplary embodiment includes a power source bus line 310 having narrow portions 310a with width smaller than that of other portions around the intersection between display data signal lines 53 and the power source bus line 310 instead of the power source bus line 54 of the electro-optical device according to the first exemplary embodiment illustrated in FIG. 1.

The power source bus line 310 illustrated in FIG. 21 includes a plurality of narrow portions 310a corresponding to the respective display data signal lines 53. The display data signal lines 53 are connected to the respective terminals of the terminal portion 102. The power source bus line 310 is connected to a plurality of terminals of the terminal portion 102 in order to secure current capacity. It is preferable that the terminals of the terminal portion have a uniform size and are arranged at uniform intervals so that the terminals are easily connected to external devices.

The power source bus line 310 is a thin metal film with uniform thickness and is made of Al or AlSiCu, an alloy of Al. The distance by which the adjacent display data signal lines 53 are separated from each other is about 70 μm. The width of the display data signal line 53 is about 6 μm. Since the narrow portions 310a are provided for the display data signal lines 53, the distance by which the narrow portions 310a are separated from each other is about 70 μm. The length of the narrow portion 310a is set in accordance with the width of the display data signal line 53 that intersects the power source bus line 310 at the narrow portion 310a. According to the present exemplary embodiment, the length of the narrow portion 310a is set as a value obtained by adding 6 μm to the width of the display data signal line 53, allowing for an error of positional difference between the power source bus line 310 and the display data signal line 53.

The width $W_1$ of the narrow portion 310a is formed to be smaller than the width $W_2$ of the other portions of the power source bus line 310. The area of intersection between the power source bus line 310 and the display data signal line 53 is obtained by multiplying the line width of the power source bus line 310 by the line width of the display data signal line 53. Therefore, when the display data signal lines 53 intersect the power source bus line 310 at the narrow portions 310a according to the present exemplary embodiment, it is possible to reduce the area of the intersection to $W_1/W_2$. Thus, it is possible to reduce the parasitic capacitance of the display data signal line 53 which is generated at the intersection.

In order to obtain the same current supply characteristic as that of the power source bus line according to the first exemplary embodiment with the uniform line width $W_0$ as illustrated in FIG. 1, it is preferable to compensate for the increase in the resistance which is generated by setting the width $W_1$ of the narrow portion 310a to be smaller than $W_0$, by setting the line width $W_2$ of the other portions of the power source bus line 310 to be larger than $W_0$. The line width in consideration of the amount of compensation is obtained by the following equation.

Equation 1

$$W_2=L_2W_0W_1/((L_1+L_2)W_1-L_1W_0)$$

Wherein, $L_1$ represents the length of the narrow portion 310a and $L_2$ represents the length of the other portion 310a.

When the ratio between the line width $W_2$ and $W_0$ is obtained based on the length of the narrow portion 310a and the length of the other portion 310a according to the present exemplary embodiment using the equation 1, it is noted that, in the case where the width $W_1$ of the narrow portions 310a is set to be about 1/10 of $W_2$, $W_2$ is set to be about twice $W_0$.

Eleventh Exemplary Embodiment of Electro-Optical Device

Figure 22:
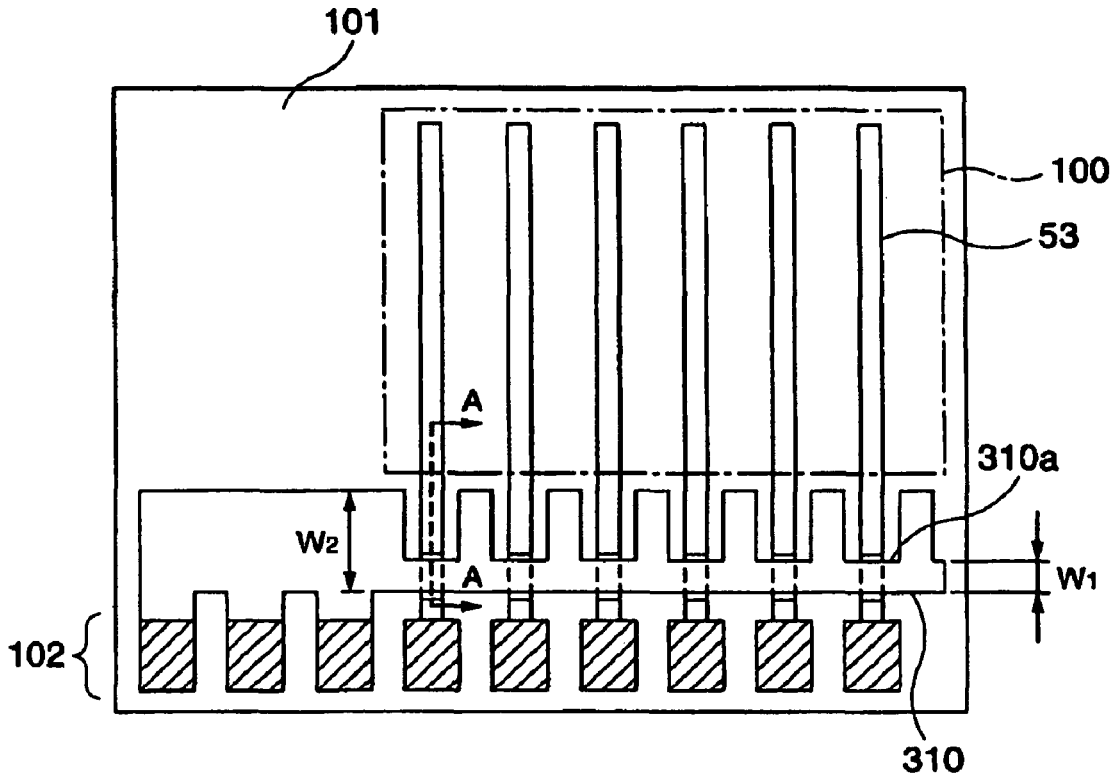
FIG. 22 is a schematic plan view illustrating an electro-optical device according to an eleventh exemplary embodiment of the present invention.
Figure 23:
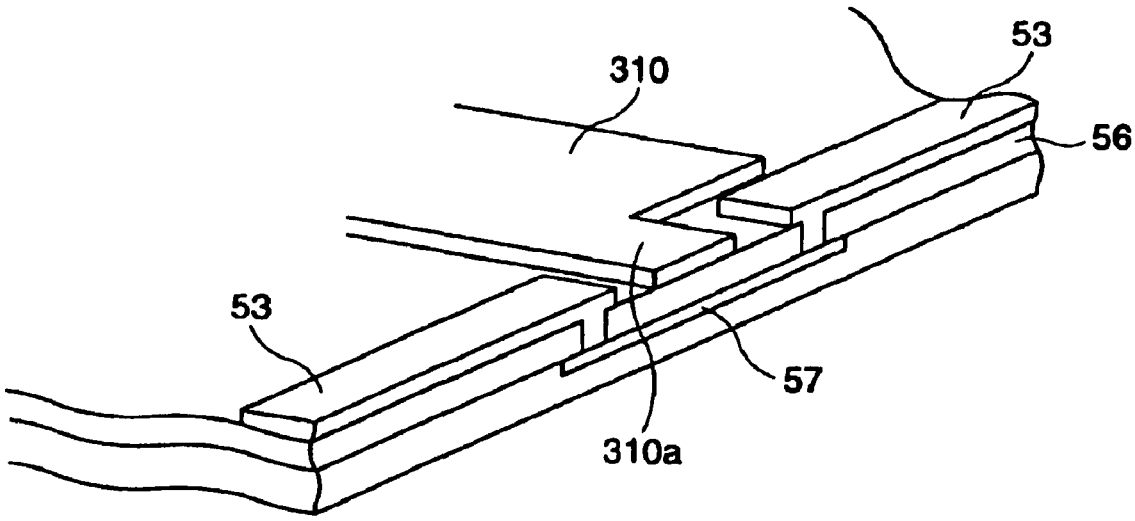
FIG. 23 is a sectional perspective view illustrating intersection of the electro-optical device according to the eleventh exemplary embodiment of the present invention.

FIG. 22 is a plan view of an electro-optical device according to an eleventh exemplary embodiment of the present invention. FIG. 23 is a perspective view of the structure of the intersection (a perspective view taken along the plane A-A in FIG. 22). According to the present exemplary embodiment, the display data signal line 53 and the power source bus line 310 are formed in the same layer. At the intersection between the display data signal line 53 and the power source bus line 310, the display data signal line 53 goes over the power source bus line 310 with a bypass conductive line made of Si containing impurities with a larger sheet resistance value than that of the metal. At the intersection, the bypass wiring line 57 of the display data signal line 53 faces the power source bus line 310 with an interlayer insulating layer 56 of a thickness of several hundred nm interposing between the bypass wiring line 57 and the power source bus line 310.

The power source bus line 310 includes narrow portions 310a at the intersection between the power source bus line 310 and the display data signal lines 53, thereby to reduce the length of the bypass wiring line 57 of the display data signal line 53.

The bypass wiring line 57 is made of Si containing impurities with a much higher sheet resistance value than that of Al or AlSiCu of the alloy of Al, of which the display data signal line 53 is formed as mentioned above. Therefore, it is possible to reduce the total amount of wiring line resistance by reducing the length of the bypass wiring line 57. Since the narrow portion of the power source bus line intersects the bypass wiring line 57 of the display data signal line, it is possible to reduce the area of the intersection between the bypass wiring line 57 and the power source bus line, thereby to reduce the parasitic capacitance generated at the intersection.

In the case where a wiring line layer with the bypass wiring line 57 is also formed of a material with a small sheet resistance value such as Al or AlSiCu of the alloy of Al, it is possible to simplify the structure of the wiring layer by arranging the power source bus line 310 and the display data signal line 53 in different wiring layers so that they can intersect each other without one bypassing at the intersection as above.

In this regard, the narrow portion 310a of the power source bus line 310 intersects the display data signal lines 53, and thus it is possible to reduce the area of the intersection. Thereby, it is possible to reduce the parasitic capacitance generated in the corresponding intersection.

In FIG. 23, the display data signal line 53 and the power source bus line 310 are formed in the same layer. At the intersection between the display data signal line 53 and the power source bus line 310, the display data signal line 53 crosses over the power source bus line 310 by a bypass conductive line made of Si containing the impurities with a larger sheet resistance value than that of the metal. However, the power source bus line 310 may go over the display data signal line 53 by a bypass conductive line made of Si containing the impurities with a larger sheet resistance value than that of the metal.

Here also, the narrow portion 310a of the power source bus line 310 intersects the display data signal line 53. Thus, it is possible to reduce the area of the intersection between the display data signal line 53 and the power source bus line 310 and thereby to reduce the parasitic capacitance generated in the corresponding intersection.

Twelfth Exemplary Embodiment of Electro-Optical Device

Figure 24:
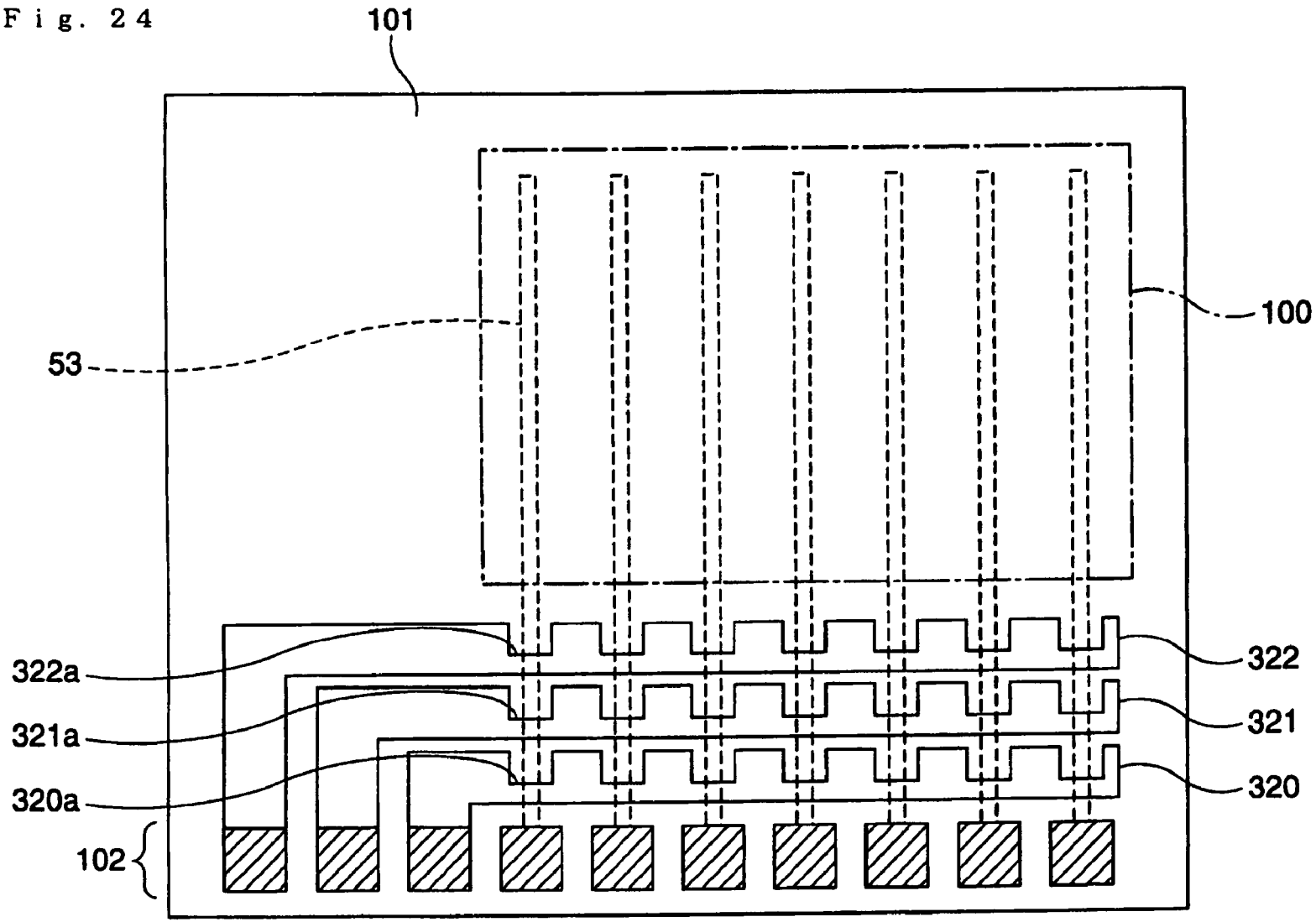
FIG. 24 is a schematic plan view illustrating an electro-optical device according to a twelfth exemplary embodiment of the present invention.

FIG. 24 illustrates an electro-optical device according to a twelfth exemplary embodiment of the present invention. In FIG. 24, the same reference numerals indicate the same elements as those of FIG. 21.

According to the tenth and eleventh exemplary embodiments, only one power source bus line 310 is provided at one side of the frame portion 101 where the mounting terminal portion 102 is provided corresponding to all of the red, green, and blue electro-optical elements (not shown). However, the electro-optical device of the present exemplary embodiment provides separate power source bus lines for the respective red, green, and blue electro-optical elements. Therefore, it is possible to supply the optimal driving voltage to the respective color electro-optical elements even if the optimal driving voltages of the respective colors electro-optical elements vary.

As illustrated in FIG. 24, three power source bus lines parallel to each other are connected to the mounting terminal portion 102 from the left upper portion of FIG. 23. That is, the electro-optical device according to the present exemplary embodiment includes a power source bus line 320 for the red electro-optical element, a power source bus line 321 for the blue electro-optical element, and a power source bus line 322 for the green electro-optical element.

Conditions such as the sizes of narrow portions 320a, 321a, and 322a provided in the respective power source bus lines 320, 321, and 322 are the same as those of the electro-optical device according to the tenth exemplary embodiment. According to the present exemplary embodiment, it is possible to obtain the same effects as those of the tenth exemplary embodiment. Furthermore, current is supplied from the independent power source bus lines to the red, green, and blue electro-optical devices, and thus it is possible to appropriately control the driving voltages supplied to the red, green, and blue current-driven elements. Therefore, it is possible to obtain an electro-optical device with excellent efficiency and a suppressed display unevenness.

Figure 25:
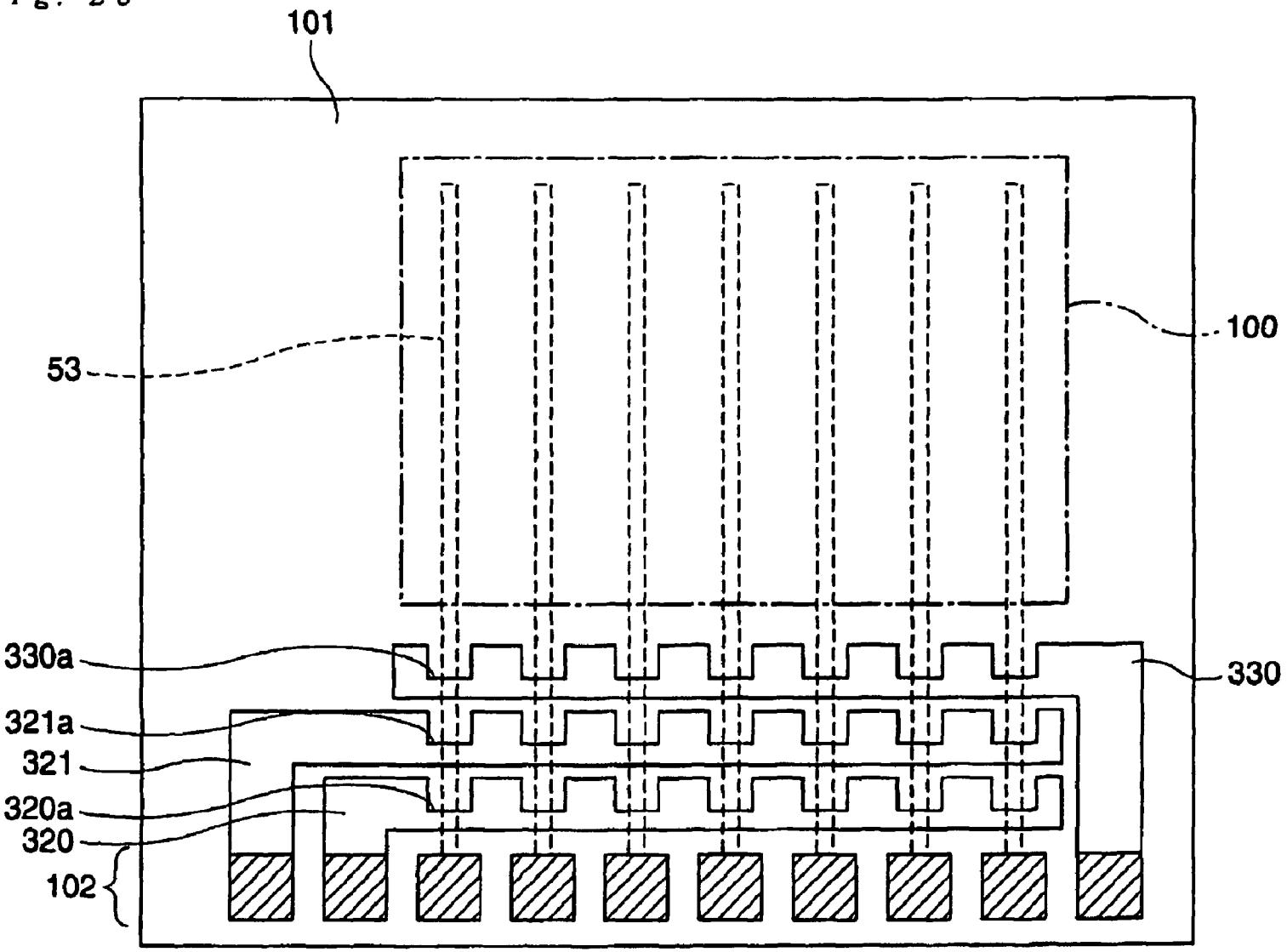
FIG. 25 is a schematic plan view illustrating an electro-optical device according to a modification of the twelfth exemplary embodiment of the present invention.

According to a modification of the twelfth exemplary embodiment of the present invention, which is illustrated in FIG. 25, it is possible to change the arrangement of mounting terminals for a power source bus line. According to the present modification, the mounting terminal of a power source bus line 330 for red is arranged to be separated from the mounting terminals of the power source bus lines 320 and 321 for other colors. That is, the mounting terminal of the power source bus line for red is arranged in one end of the mounting terminal portion 102, and the mounting terminals of the power source bus lines for the other colors are arranged in the other end of the mounting terminal 102. It is preferable that the power source bus lines be arranged in the ends of the mounting terminal 102 and to assign a plurality of terminals to each end in order to secure current capacitance. It is possible to set the width of the right and left frames with excellent balance by arranging the mounting terminals of the power source bus lines 320, 321, and 330 in both ends of the mounting terminal portion 102 according to the present modification. Therefore, it is possible for the electro-optical device to have a structure with excellent balance.

Thirteenth Exemplary Embodiment of Electro-Optical Device

Figure 26:
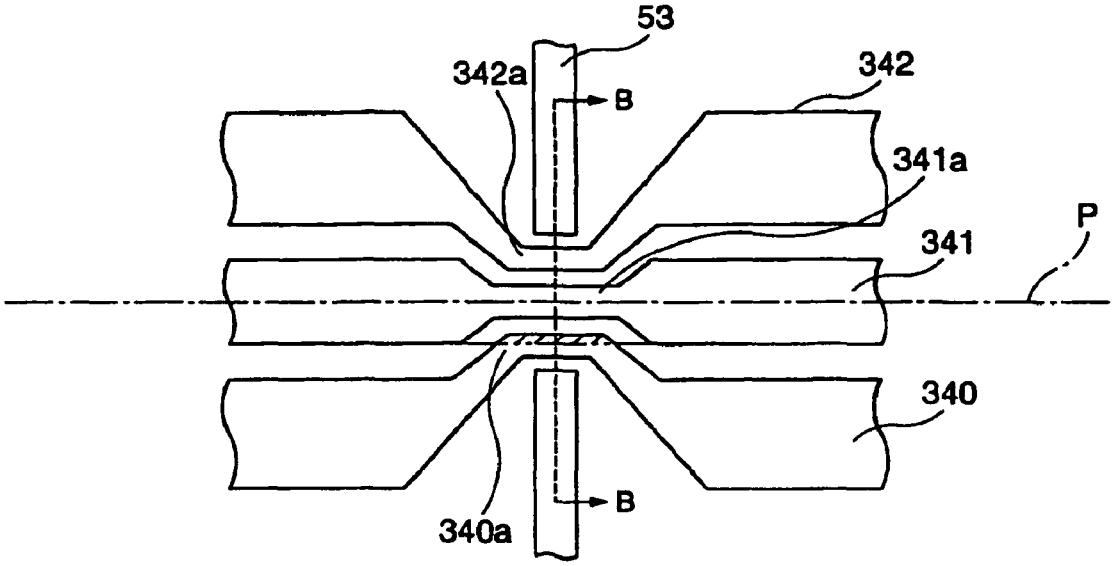
FIG. 26 is a plan view illustrating intersection of an electro-optical device according to a thirteenth exemplary embodiment of the present invention.
Figure 27:
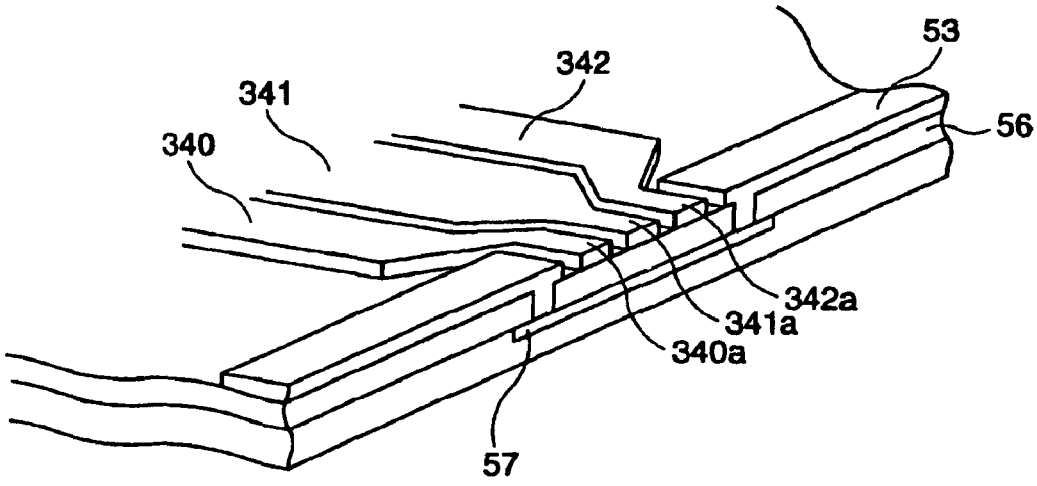
FIG. 27 is a sectional perspective view illustrating the intersection of the electro-optical device according to the thirteenth exemplary embodiment of the present invention.

FIG. 26 is a plan view illustrating the intersection of an electro-optical device according to a thirteenth exemplary embodiment of the present invention. FIG. 27 is a perspective view illustrating the structure of the corresponding intersection (a perspective view of section along the line B-B in FIG. 26). According to the present exemplary embodiment, the display data signal line 53 and power source bus lines 340, 341, and 342 are formed in the same layer. At the intersection, the display data signal line 53 cross over the power source bus lines 340, 341, and 342 by the bypass wiring line 57 made of Si containing the impurities with a larger sheet resistance value than that of the metal material. At the intersection, the bypass wiring line 57 of the display data signal line 53 faces the power source bus lines 340, 341, and 342 with an interlayer insulating layer 56 of a thickness of several hundred nm therebetween.

The power source bus lines 340, 341, and 342 have narrow portions 340a, 341a, and 342a at the intersections between the power source bus lines 340, 341, and 342 and the display data signal line 53. Therefore, it is possible to reduce the length of the bypass wiring line 57 of the display data signal line 53. According to the present exemplary embodiment, the distance between the power source bus lines in the narrow portions 340a, 341a, and 342a is almost equal to that at the other portions, so that it is possible to further reduce the total of the widths of the narrow portions and the distances between the power source bus lines and thereby to further reduce the length of the bypass wiring line 57.

In the case where the wiring line layer with the bypass wiring line 57 is made of a material with a small sheet resistance value such as Al or AlSiCu of the alloy of Al, it is possible to simplify the structure of the wiring layer by arranging the power source bus lines 340, 341, and 342 and the display data signal line 53 in different wiring layers that intersect each other without bending at the intersection as mentioned above.

Here also, the narrow portions 340a, 341a, and 342a of the power source bus lines 340, 341, and 342 intersect the display data signal line 53. Therefore, it is possible to reduce the areas of the intersection and thereby to reduce the parasitic capacitance generated in the corresponding intersection.

In FIG. 27, the display data signal line 53 and the power source bus lines 340, 341, and 342 are formed in the same layer. At the intersection between the display data signal line 53 and the power source bus lines 340, 341, and 342, the display data signal line 53 crosses under the power source bus lines 340, 341, and 342 by a bypass conductive line made of Si containing impurities and with a larger sheet resistance value than that of the metal. However, the power source bus lines 340, 341, and 342 may cross over the display data signal line 53 by a bypass conductive line made of Si containing the impurities and with a larger sheet resistance value than that of the metal.

Here also, the narrow portions 340a, 341a, and 342a of the power source bus lines 340, 341, and 342 intersect the display data signal line 53. Thus, it is possible to reduce the area of the intersection and thereby to reduce the parasitic capacitance generated in the corresponding intersection.

In another aspect, part of the narrow portion 340a of the power source bus line 340 (the inclined line portion of the narrow portion 340a in FIG. 26) overlaps the extended portion (the two dot chain line marked to the power source bus line 341 in FIG. 26) of a normal portion (a portion other than the narrow portion) of another power source bus line 341. This shows that it is possible to arrange the narrow portions of the plurality of power source bus lines to be close to each other and to reduce the length of the bypass wiring line 57 that collectively detours the narrow portions of the plurality of power source bus lines. According to the present exemplary embodiment, some of the narrow portion 340a overlaps the extended portion of the normal portion. However, the entire narrow portion 340a may overlap the corresponding portion to obtain the same effect.

In another aspect, the plurality of narrow portions is almost symmetric with respect to the central line P (FIG. 26) of the plurality of power source bus lines. Therefore, it is possible to reduce the sum of the lengths of the narrow portions of the respective power source bus lines and to reduce the amount of the increase in the resistance value in the narrow portions.

Electronic Apparatus

Exemplary embodiments of an electronic apparatus with the electro-optical device will now be described.

Figure 15:
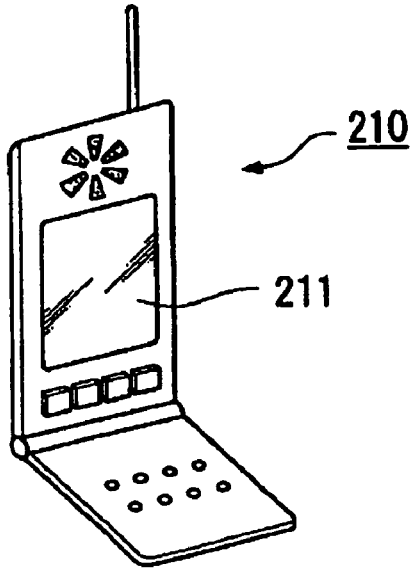
FIGS. 15(a)-15(c) are examples of electronic apparatus with an electro-optical device according to the present invention.
Figure 15:
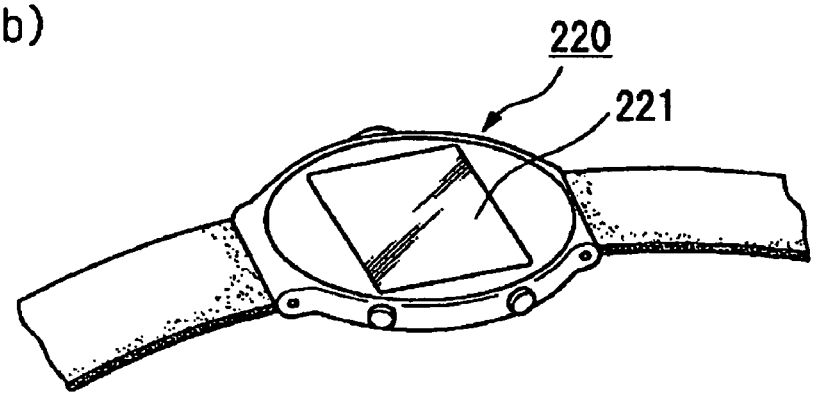
Figure 15:
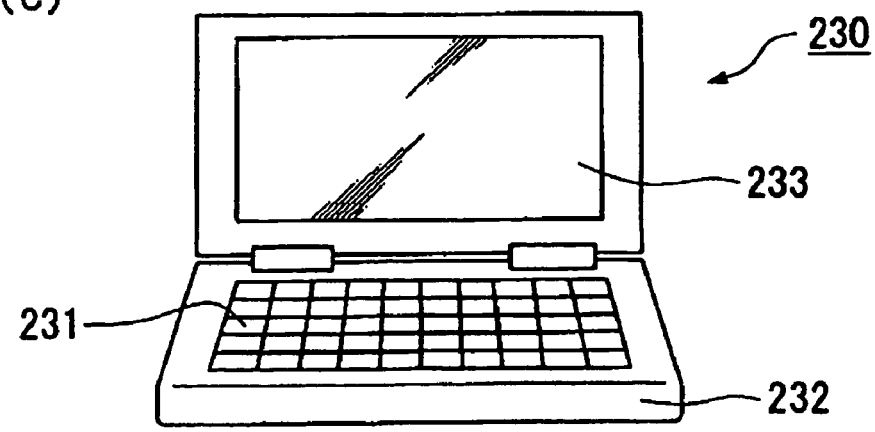

FIG. 15(a) is a perspective view illustrating an example of a mobile telephone. In FIG. 15(a), a mobile telephone main body 210 includes a display portion 210 using the aforementioned electro-optical device.

FIG. 15(b) is a perspective view illustrating an example of a wristwatch type electronic apparatus. In FIG. 15(b), a watch main body 220 includes a display portion 221 using the aforementioned electro-optical device.

FIG. 15(c) is a perspective view illustrating an example of portable information processing devices such as word processors and personal computers. In FIG. 15(c), an information processing device 230 includes an input portion 231 such as a keyboard, a main body 232 of information processing device, and a display portion 233 using the aforementioned electro-optical device 233.

In the electronic apparatuses illustrated in FIGS. 15(a) to 15(c), the display portion is a significantly important element. Their practical performance is significantly affected by the display quality of the display portion. Therefore, the electronic apparatus according to the present exemplary embodiment may become a high performance electronic apparatus having a display portion with excellent display quality by including the aforementioned electro-optical device according to the present exemplary embodiment with an excellent light emitting gray scale characteristic.

The electro-optical device and the electronic apparatus according to the present exemplary embodiment are described. However, the present invention is not limited to the above exemplary embodiment and can be modified within the scope of the present invention.

Figure 16:
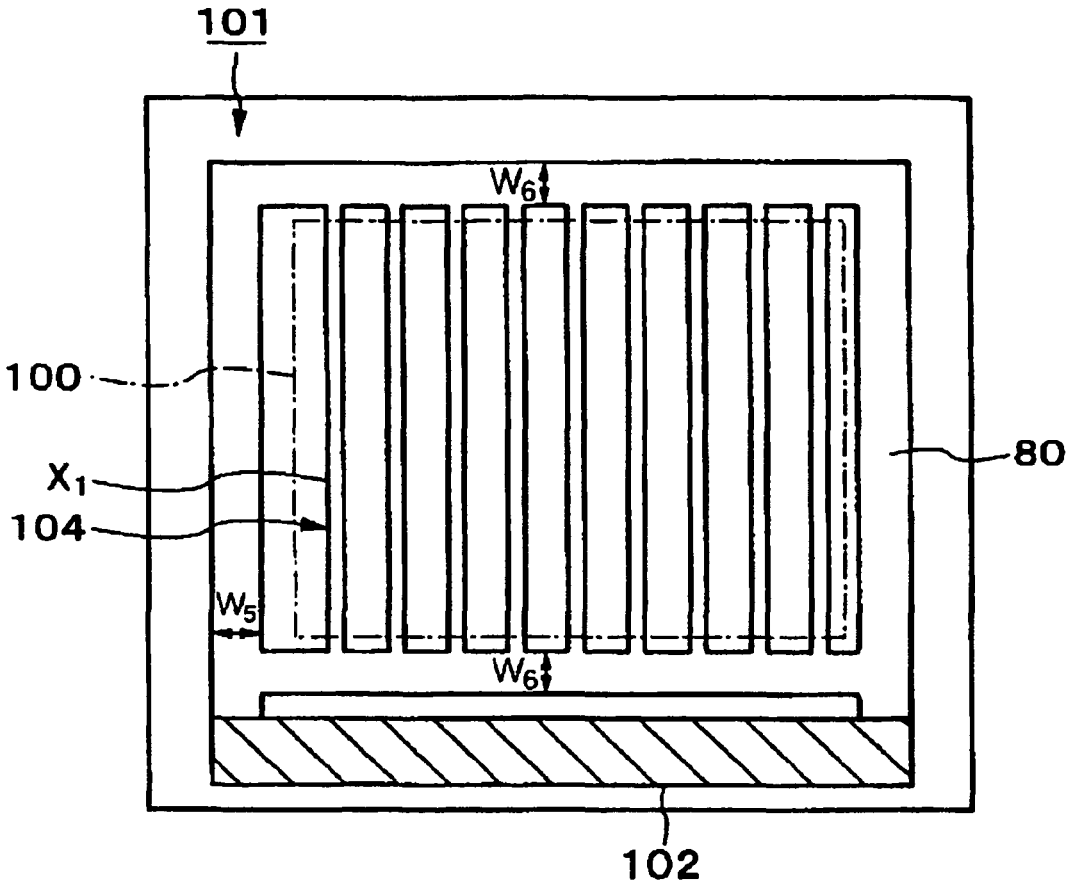
FIG. 16 is a schematic illustrating an electro-optical device according to a modification of the above exemplary embodiment.

For example, the seventh exemplary embodiment illustrated in FIG. 11 includes the thirteenth power source bus line 60 with the conductive portion 60a connected parallel to the conductive portion 50a of the eleventh power source bus line 50 and connected from the fourth region 101d to the mounting terminal portion 102. However, according to the present invention, it is possible to expand the above structure. That is, as illustrated in FIG. 16, it is possible to form a power source bus line 80 so as to surround the matrix display portion 100 by connecting the eleventh power source bus line 50 in FIG. 11 to the thirteenth power source bus line 60 in FIG. 11. Thereby, it is possible to prevent the voltage drop without widening the width of the power source bus line, that is, without widening the region of the frame portion 101 in which the power source bus line is arranged.

Figure 17:
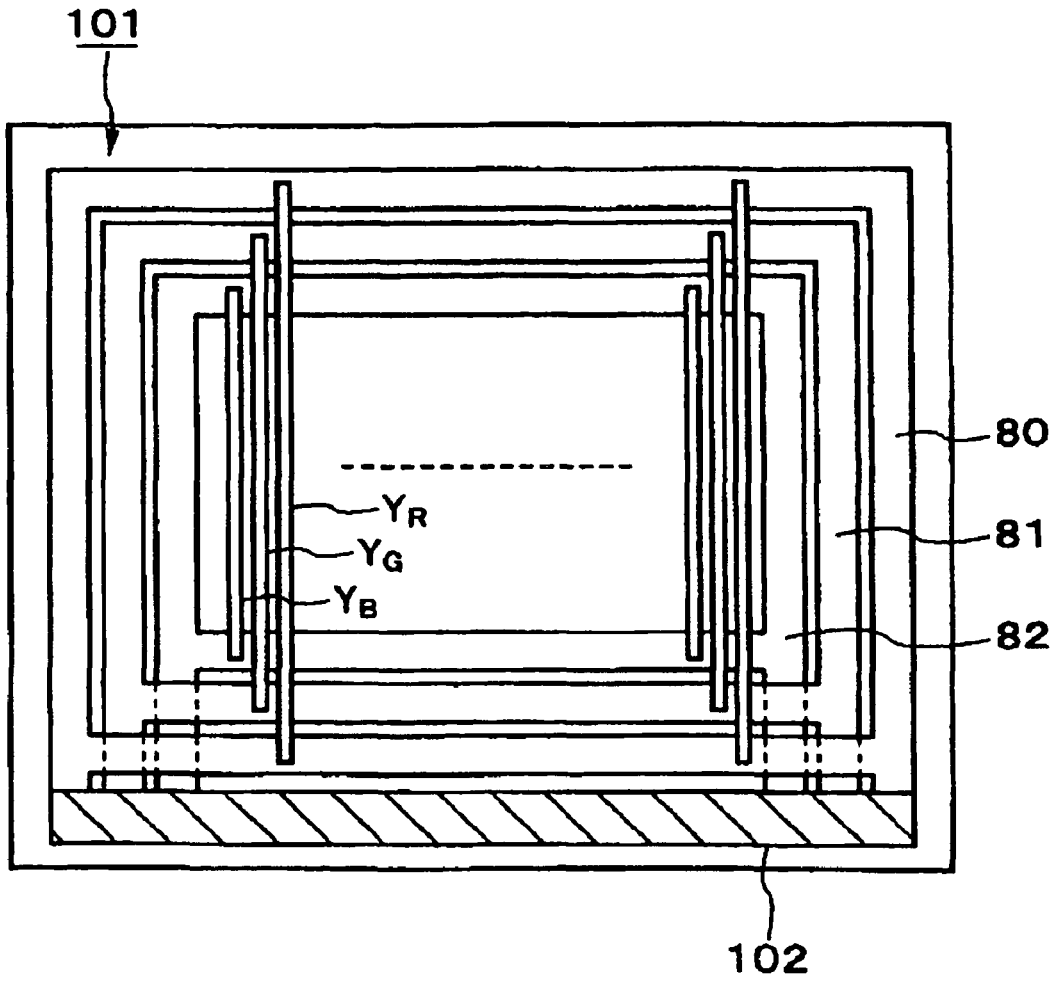
FIG. 17 is a schematic illustrating an electro-optical device according to a modification of the above exemplary embodiment.

Furthermore, the ninth exemplary embodiment illustrated in FIG. 14 includes three groups of power source bus lines corresponding to the red, green, and blue current-drive elements, and the twentieth, twenty first, and twenty second power source bus lines 76, 77, and 78 arranged in the first region 101a are connected from the fourth region 101d to the mounting terminal 102 as in the seventh exemplary embodiment. However, here also it is possible to expand the structure of the power source bus line. That is, as illustrated in FIG. 17, it is possible to form the power source bus lines 80, 81, and 82 so as to surround the matrix display portion 100 by connecting the power source bus lines in FIG. 14 to the corresponding colors, respectively. By doing so, it is possible to obtain the same effects as those of the seventh exemplary embodiment.

According to the fourth, fifth, eighth, and ninth embodiments, the number of power source bus lines is three so as to supply current to the respective red, green, and blue current-driven elements. However, the present invention is not limited thereto. That is, two power source bus lines, one for the red current-driven element and the other for the green and blue current-driven elements may be used. According to the present structure, it is possible to appropriately control the current values supplied to the current-driven elements of the respective colors of red and green+blue. Therefore, it is possible to obtain an electro-optical device with excellent efficiency and suppressed display irregularity. Furthermore, it is possible to make the entire electro-optical device be a structure with excellent balance compared to a case where three power source bus lines are used.

According to the present exemplary embodiment, the narrow portions are formed in the power source bus line at the intersection between the power source bus line and the display data signal lines. However, the present invention is not limited thereto. For example, it is possible to make the width of the power source bus line uniform, to form narrow portions in the display data signal lines in the vicinity of the intersection with the power source bus line, or it is possible to form narrow portions in both the power source bus line and the display data signal lines at the intersection between the power source bus line and the display data signal lines. According to these structures, it is possible to reduce the parasitic electrostatic capacitance of the display data signal line and thereby to precisely supply current to the electro-optical element as in the above exemplary embodiment.

According to the above exemplary embodiment, as illustrated in FIGS. 21 to 25, the narrow portion 310a is concave. The narrow portion is formed in the edge of a wiring line in the width direction of the wiring line. Since it is possible to simplify the shape of the wiring line, it is possible to easily manufacture the wiring line and to prevent the generation of unnecessary radiation.

Figure 28:
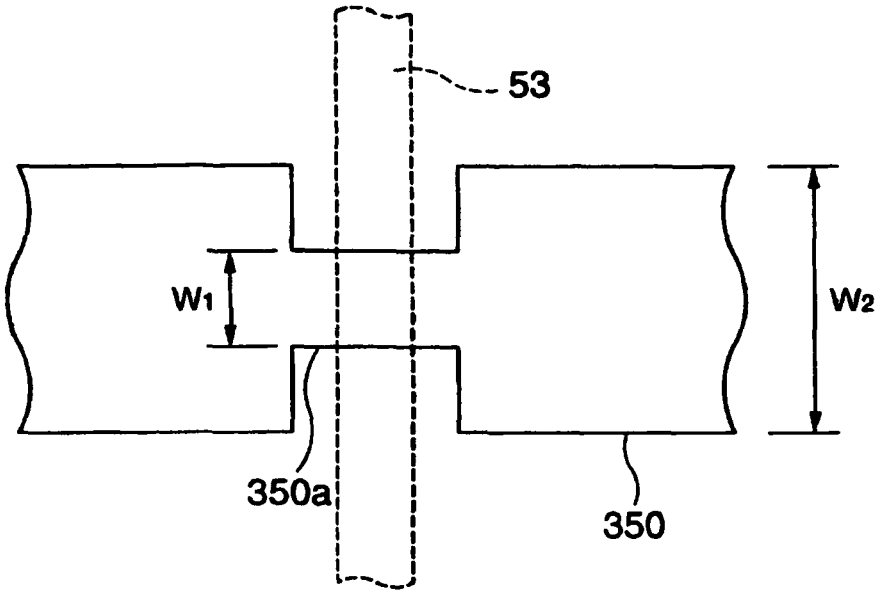
FIGS. 28(a)-28(b) are plan views illustrating another shape of a narrow portion of a power source bus line according to an exemplary embodiment of the present invention.
Figure 28:
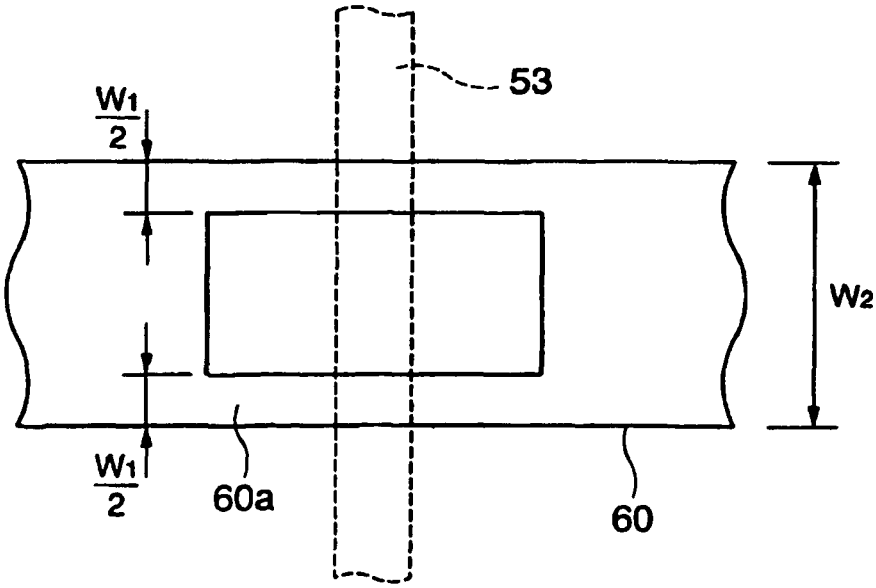

For example, as illustrated in FIG. 28(a), at the intersection between the display data signal line 53 and the power source bus line 350 with the width $W_2$, the narrow portion 350a with the width $W_1$ may be formed by providing concave portions on the left and right of the power source bus line. In doing so, current flows smoothly inside the wiring line. When the width of the wiring line is large, it is possible to reduce effective resistance below that where the narrow portion is formed at an edge.

Furthermore, as illustrated in FIG. 28(b), at the intersection between the display data signal line 53 and the power source bus line 60 with the width $W_2$, it is possible to form a path with the width $W_2$-$W_1$ on the power source bus line, thereby to provide a narrow portion 60a. Here also, there may be plural paths. The relationship between the width $W_1$ and the width $W_2$ is the same as that according to the tenth exemplary embodiment. According to the above structure, it is possible to obtain the same effects as those of the above exemplary embodiment. Furthermore, even if one wiring line is cut off by an external shock, it is possible to compensate for the damage with the remaining wiring lines by preparing the plurality of wiring lines of the narrow portion.

According to twelfth and thirteenth exemplary embodiments, the number of power source bus line is three, so as to supply current to the respective red, green, and blue electro-optical elements. However, the present invention is not limited thereto. For example, two power source bus lines, one for the red electro-optical element and the other for the green and blue electro-optical elements may be provided. According to the above structure, it is possible to appropriately set the voltages supplied to the red electro-optical element and to the green and blue electro-optical elements, respectively. Therefore, it is possible to obtain an electro-optical device with excellent efficiency and with a suppressed display irregularity. Furthermore, when an even number of power source bus lines is used, it is possible to have the excellent wiring line balance for the entire electro-optical device compared to the case where an odd number of power source bus lines is used.

Advantages

As mentioned above, according to the present invention, it is possible to narrow the frame. Also, it is possible to prevent the current unevenness and brightness unevenness without widening the frame and thereby to improve the display quality of the electro-optical device and the electronic apparatus.

Furthermore, according to the present invention, a narrow portion is provided at the intersection between the power source bus line and the display data signal line either in the power source bus line or in the display data signal line. Therefore, it is possible to reduce the parasitic electrostatic capacitance of the display data signal line. When the wiring line not provided with the narrow portion has a bypass wiring line layer with larger specific resistance, it is possible to reduce the length of the bypass wiring line and thereby to prevent the increase in the resistance of the corresponding wiring line. Therefore, it is possible to precisely supply current to the electro-optical element and thereby to obtain the excellent light emitting gray scale characteristic.

What is claimed is:

1. An electro-optical device, comprising:

a plurality of pixel circuits that are provided in an effective region of a base and each of which includes an electro-optical element;

a first wiring line through which one of a control signal and a driving power is supplied to the plurality of pixel circuits; and a second wiring line through which the other of the control signal and the driving power is supplied to the plurality of pixel circuits, the first wiring line intersecting the second wiring line at an intersection that is located between the effective region and at least one edge of a plurality of edges constituting an outline of the base, and the first wiring line having a first portion and a second portion whose width is narrower than a width of the first portion, and the second portion being provided at the intersection.

2. The electro-optical device according to claim 1, the second wiring line being provided in a layer in which the first wiring line is not formed.

3. The electro-optical device according to claim 1, the second wiring line having a third portion and a fourth portion whose width is narrower than a width of the third portion, and the fourth portion being provided at the intersection.

4. The electro-optical device according to claim 1, the [narrow portions] *second portion* being provided near one of the ends in [the] *a* width direction of [corresponding] *the first* wiring [lines] *line*.

5. The electro-optical device according to claim 1, the [narrow portions are] *second portion is* formed by cutting out portions at both ends in [the] *a* width direction of the [corresponding] *first* wiring [lines] *line*.

6. The electro-optical device according to claim 1,

[the path] *an inter-layer passage* being provided corresponding to *a location of* the second portion.

7. The electro-optical device according to claim 1, the control signal being supplied to the plurality of pixel circuits through the first wiring line, and the driving power being supplied to the plurality of pixel circuits through the second wiring line.

8. The electro-optical device according to claim 7, the first wiring line comprising:

a main wiring line portion provided in the same wiring line layer as the second wiring line;

a bypass wiring line portion provided in a different wiring line layer from the second wiring line and intersecting the second wiring line [at a different layer]; and a connection [position to connect] *between* the main wiring line portion and the bypass wiring line portion [to each other].

9. The electro-optical device according to claim 7, the second wiring line comprising:

a main wiring line portion provided in the same wiring line layer as the first wiring line;

a bypass wiring line portion provided in a different wiring line layer from the first wiring line and intersecting the first wiring line [at a different layer]; and a connection [position to connect] *between* the main wiring line portion and the bypass wiring line portion [to each other].

10. The electro-optical device according to claim 7, the first wiring line being provided in a different wiring line layer from the second wiring line and [intersects] *intersecting* the second wiring line [at a different layer].

11. The electro-optical device according to claim 7, the *second portion of the* first wiring line [having narrow portions at intersections between the] *intersecting* narrow portions of the second wiring line [and the first wiring line].

12. The electro-optical device according to claim 11, the narrow portions of the [plurality of power source bus lines] *second wiring line* being symmetric with respect to [the] *a* longitudinal line passing through [the] *a* width-wise center of the [plurality of power source bus lines] *second wiring line*.

13. The electro-optical device according to claim 7, [each of] a plurality of *the* second wiring lines being separated from [another second wiring line] *each other* by a constant spacing at [the] narrow portions *of the plurality of second wiring lines*.

14. The electro-optical device according to claim 7, part or all of [the] narrow portions of one of *a plurality of* the second wiring lines overlap [the] *a* region where another *of the plurality of* second wiring [line] *lines* would be [if it] *located if the another second wiring line* did not have a narrow portion.

15. The electro-optical device according to claim 7, the plurality of electro-optical elements [with different characteristics being characterized in that among the electro-optical elements are those emitting] *emit* different color lights.

16. An electronic apparatus, comprising:

an electro-optical device according to claim 1;

a driving power source circuit connected to *one of the first and second wiring lines of* the electro-optical device to supply a driving power [source to wiring lines to supply the driving power source or to the power source bus lines]; and a control signal generating circuit connected to *the other of the first and second wiring lines of* the electro-optical device to supply control signals [to wiring lines to supply the control signal or to the signal lines].

17. An electro-optical device, comprising:

an electro-optical element;

a first wiring line through which one of a control signal and a driving power is supplied to the electro-optical element, the first wiring line having a first portion and a second portion; and a second wiring line through which the other of the control signal and the driving power is supplied to the electro-optical element, the second wiring line having a third portion, a fourth portion and a fifth portion that connects the third portion and the fourth portion, the second portion of the first wiring line intersecting the fifth portion of the second wiring line, the third portion and the first wiring line being provided in a first wiring layer, and the fifth portion being provided in a second wiring layer where the first wiring line is not formed, and a width of the second portion being narrower than a width of the first portion.

18. The electro-optical device according to claim 17, wherein the intersection between the first wiring line and the second wiring line is located between an effective region *of the electro-optical element* and at least one edge of a plurality of edges constituting an outline of a base *of the electro-optical element*.

* * * * *